(12) United States Patent
Tomoda

(10) Patent No.: US 7,763,901 B2
(45) Date of Patent: Jul. 27, 2010

(54) ELECTRONIC DEVICE, METHOD OF PRODUCING THE SAME, LIGHT-EMITTING DIODE DISPLAY UNIT, AND METHOD OF PRODUCING THE SAME

(75) Inventor: Katsuhiro Tomoda, Kanagawa (JP)

(73) Assignee: Sony Corporation, Tokyo (JP)

( * ) Notice: Subject to any disclaimer, the term of this patent is extended or adjusted under 35 U.S.C. 154(b) by 241 days.

(21) Appl. No.: 11/877,492

(22) Filed: Oct. 23, 2007

(65) Prior Publication Data

US 2008/0224153 A1 Sep. 18, 2008

(30) Foreign Application Priority Data

Dec. 4, 2006 (JP) ............................ P 2006-326488

(51) Int. Cl.
*H01L 33/00* (2010.01)
(52) U.S. Cl. .................................. 257/88; 257/E21.598
(58) Field of Classification Search .................... 257/99, 257/100, 686, 88, E21.598
See application file for complete search history.

(56) References Cited

U.S. PATENT DOCUMENTS 6,551,440 B2 * 4/2003 Tanaka ........................ 156/292
2002/0025122 A1 * 2/2002 Ouchi et al. ................... 385/88

FOREIGN PATENT DOCUMENTS

JP 2004-273596 3/2003
JP 2004-281630 3/2003

* cited by examiner

*Primary Examiner*—Jerome Jackson, Jr.
*Assistant Examiner*—Dale Page
(74) *Attorney, Agent, or Firm*—K&L Gates LLP

(57) ABSTRACT

An electronic device includes a base having a first wiring thereon; a flexible film having a second wiring thereon; a plurality of elements each including a first connecting portion and a second connecting portion; and an adhesive agent layer, wherein each of the elements is sandwiched between the base and the film in a state in which the first connecting portion is in contact with the first wiring, the second connecting portion is in contact with the second wiring, and a tensile force is applied to the film, and, in this state, the base and the film are bonded with the adhesive agent layer.

6 Claims, 12 Drawing Sheets

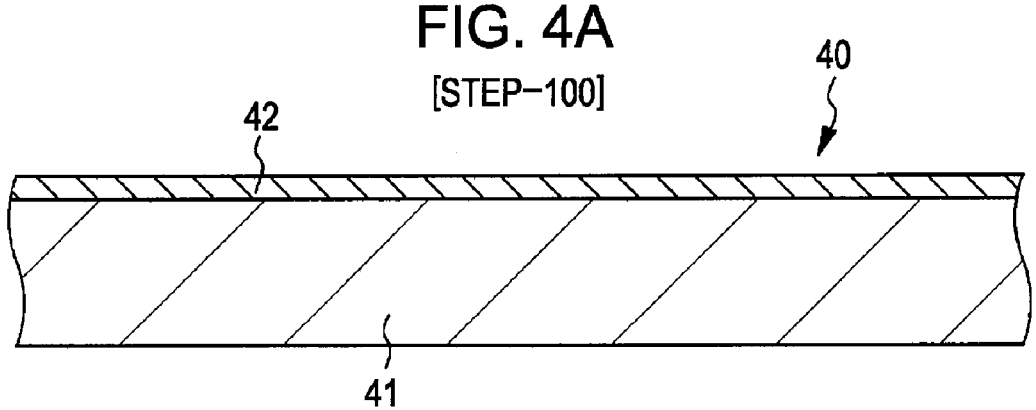
FIG. 4A [STEP-100]
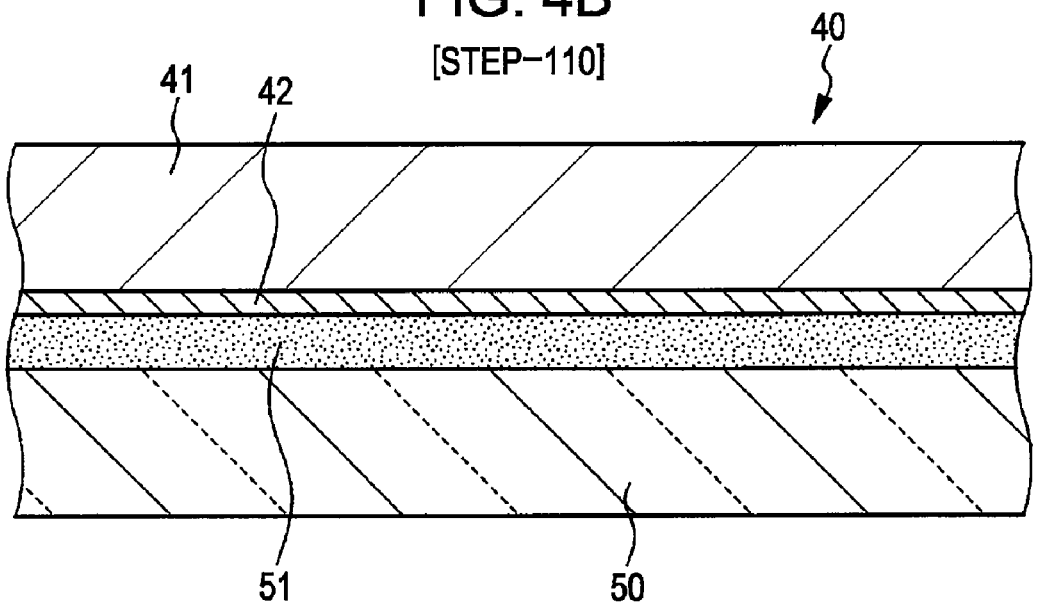
FIG. 4B [STEP-110]
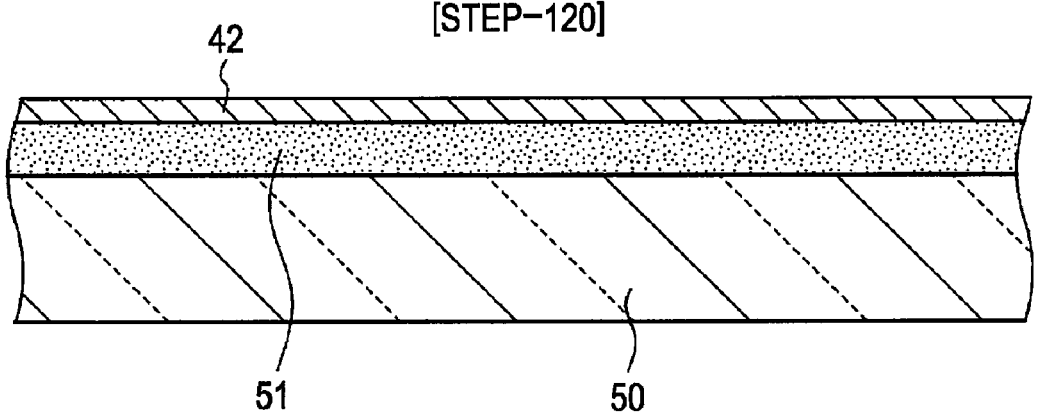
FIG. 4C [STEP-120]

[STEP-130]

[STEP-140]

CONTINUATION OF [STEP-140]

CONTINUATION OF [STEP-140]

CONTINUATION OF [STEP-140]

CONTINUATION OF [STEP-140]

CONTINUATION OF [STEP-140]

ELECTRONIC DEVICE, METHOD OF PRODUCING THE SAME, LIGHT-EMITTING DIODE DISPLAY UNIT, AND METHOD OF PRODUCING THE SAME

CROSS REFERENCES TO RELATED APPLICATIONS

The present application claims priority to Japanese Patent Application JP 2006-326488 filed in the Japanese Patent Office on Dec. 4, 2006, the entire contents of which are incorporated herein by reference.

BACKGROUND

The present application relates to an electronic device, a method of producing the same, a light-emitting diode display unit, and a method of producing the same.

An example of various electronic devices produced by mounting fine elements on a substrate for a display unit is a light-emitting diode display unit. In such a light-emitting diode display unit, red-light-emitting diodes function as red-light-emitting subpixels, green-light-emitting diodes function as green-light-emitting subpixels, and blue-light-emitting diodes function as blue-light-emitting subpixels. The light-emitting diode display unit displays color images on the basis of the light-emitting state of these three types of subpixels.

A light-emitting diode display unit normally includes a plurality of first wirings extending in a first direction, a plurality of second wirings extending in a second direction different from the first direction, and a plurality of light-emitting diodes each having a first connecting portion and a second connecting portion. The light-emitting diodes are disposed on areas where the first wirings and the second wirings overlap. The first connecting portion (one electrode) of each of the light-emitting diodes is connected to a first wiring and the second connecting portion (another electrode) is connected to a second wiring.

In general, a large number of light-emitting diodes are formed in an array on a substrate (hereinafter also referred to as "substrate for element production") such as a compound semiconductor substrate. Each of the light-emitting diodes is then moved (for example, transferred) from the substrate for element production to a substrate for a display unit. Each of the light-emitting diodes formed on the substrate for element production includes a first compound semiconductor layer of an n-conductivity type, an active layer, and a second compound semiconductor layer of a p-conductivity type that are sequentially formed. Furthermore, a p-side electrode is provided on the second compound semiconductor layer, and an n-side electrode is provided on the first compound semiconductor layer.

For example, a full high-definition (HD) high-fineness full-color display unit having a diagonal of 40 inches includes 1,920 pixels in the horizontal direction of the screen and 1,080 pixels in the vertical direction of the screen. Accordingly, in this case, the number of light-emitting diodes to be mounted is 1,920×1,080×(the number of types of light-emitting diodes, namely, a red-light-emitting diode, a green-light-emitting diode, and a blue-light-emitting diode, required for forming a single pixel), that is, about 6,000,000. Accordingly, a known step transfer method (step mounting method) is used as a method of mounting such a huge number of light-emitting diodes on a substrate for a display unit having a nominal diagonal of 40 inches. In this step transfer method, light-emitting diodes are formed in an array such that the array has a size smaller than the screen size, and the light-emitting diodes are sequentially transferred from being disposed on the light-emitting diode array to being mounted on a substrate for a display unit while the positions of the light-emitting diodes are adjusted.

Such a step transfer method is disclosed in, for example, Japanese Unexamined Patent Application Publication Nos. 2004-273596 and 2004-281630. In the techniques disclosed in these publications of unexamined patent applications, a substrate for a display unit having a pressure-sensitive adhesive layer thereon is used. Fundamentally, among a plurality of light-emitting diodes formed on a substrate for element production, predetermined light-emitting diodes are transferred to a transfer substrate in a state in which the light-emitting diodes are separated from the substrate for element production. Subsequently, the light-emitting diodes are transferred from being disposed on the transfer substrate to being embedded in a pressure-sensitive adhesive layer of a substrate for a display unit so that the light-emitting diodes partly protrude therefrom. The light-emitting diodes are then deeply embedded in the pressure-sensitive adhesive layer with a roller or the like. Thus, the light-emitting diodes are mounted on the substrate for a display unit (see, for example, paragraphs [0045] to [0048] of Japanese Unexamined Patent Application Publication No. 2004-273596 and paragraphs [0038] and [0046] of Japanese Unexamined Patent Application Publication No. 2004-281630).

In order to produce a light-emitting diode display unit, as described above, light-emitting diodes are mounted on a substrate for a display unit at predetermined intervals and pitches. A first insulating layer is then formed over the entire surface of the substrate. First openings are then formed in the first insulating layer at positions corresponding to the upper part of electrodes of the light-emitting diodes, and first wirings connected to the electrodes are formed on the first insulating layer. Subsequently, the first insulating layer including the first wirings is bonded to a holding substrate with an adhesive therebetween. Subsequently, the light-emitting diodes are separated from the substrate for a display unit by, for example, a laser ablation method, and a second insulating layer is formed over the entire surface. Second openings are then formed in the second insulating layer at positions corresponding to the upper part of other electrodes of the light-emitting diodes, and second wirings connected to the other electrodes are formed on the second insulating layer. The first wirings and the second wirings are connected to a driving circuit, thus producing a light-emitting diode display unit in the related art.

SUMMARY

As described above, the production of such a light-emitting diode display unit includes a large number of steps to establish the connection between one electrode and the first wiring and the connection between the other electrode and the second wiring.

It is desirable to provide an electronic device, a method of producing the same, a light-emitting diode display unit, and a method of producing the same which have a configuration or a structure in which connecting portions and wirings provided on various elements can be connected reliably and relatively easily without performing a large number of steps.

According to an embodiment, there is provided an electronic device including (A) a base having a first wiring thereon; (B) a flexible film having a second wiring thereon; (C) a plurality of elements each including a first connecting portion and a second connecting portion; and (D) an adhesive agent layer, wherein each of the elements is sandwiched between the base and the film in a state in which the first connecting portion is in contact with the first wiring, the second connecting portion is in contact with the second wiring, and a tensile force is applied to the film, and, in this state, the base and the film are bonded with the adhesive agent layer.

According to an embodiment, there is provided a light-emitting diode display unit including (A) a base having a plurality of first wirings thereon; (B) a flexible film having a plurality of second wirings thereon; (C) a plurality of light-emitting diodes each including a first connecting portion and a second connecting portion; and (D) an adhesive agent layer, wherein each of the light-emitting diodes is sandwiched between the base and the film in a state in which the first connecting portion is in contact with one of the first wirings, the second connecting portion is in contact with one of the second wirings, and a tensile force is applied to the film, and, in this state, the base and the film are bonded with the adhesive agent layer.

According to an embodiment, there is provided a method of producing an electronic device including the steps of preparing (A') a base having a first wiring and an adhesive agent layer thereon, (B') a flexible film having a second wiring thereon, and (C') a plurality of elements each including a first connecting portion and a second connecting portion; (a) arranging the elements on the base so that the first connecting portion of each of the elements is in contact with the first wiring; and then (b) sandwiching the elements between the base and the film so that the second connecting portion of each of the elements is in contact with the second wiring and a tensile force is applied to the film, and bonding the base and the film with the adhesive agent layer while this state is maintained.

According to an embodiment, there is provided a method of producing a light-emitting diode display unit including the steps of preparing (A') a base having a plurality of first wirings and an adhesive agent layer thereon, (B') a flexible film having a plurality of second wirings thereon, and (C') a plurality of light-emitting diodes each including a first connecting portion and a second connecting portion; (a) arranging the light-emitting diodes on the base so that the first connecting portion of each of the light-emitting diodes is in contact with one of the first wirings; and then (b) sandwiching the light-emitting diodes between the base and the film so that the second connecting portion of each of the light-emitting diodes is in contact with one of the second wirings and a tensile force is applied to the film, and bonding the base and the film with the adhesive agent layer while this state is maintained.

In a method of producing an electronic device or a method of producing a light-emitting diode display unit according to an embodiment, predetermined elements or light-emitting diode (hereinafter, these may be generically referred to as "elements or the like") may be transferred from being disposed on a substrate for element production on which a plurality of elements or the like are formed to being adhered to a relay substrate, the elements or the like adhered to the relay substrate may then be arranged on the adhesive agent layer, and the elements or the like may be brought into contact with the first wiring, thereby contacting the first connecting portion to the first wiring.

In the electronic device or the method of producing an electronic device according to a preferred embodiment, the elements may be light-emitting diodes (LEDs). In the electronic device or the method of producing an electronic device according to a preferred embodiment of the present application, or in the light-emitting diode display unit or the method of producing a light-emitting diode display unit according to a preferred embodiment of the present application (hereinafter, these may be generically and simply referred to as "embodiment of the present application"), a black matrix layer is preferably provided on areas which are disposed on an inner surface of the base facing the film and on which the elements or the like are not provided. More preferably, an insulating film is further provided on the black matrix layer and the inner surface of the base. In an embodiment of the present application, convex lenses are preferably provided at positions which are disposed on an outer surface of the base, the outer surface being opposite the inner surface of the base facing the film, and to which light from the elements or the like is emitted. Instead of forming a black matrix layer on the inner surface of the base, the black matrix layer may be formed on areas on the outer surface of the base, the areas being other than areas to which light from the elements or the like is emitted.

In a preferred embodiment, when the total thickness of the first wiring and the base (i.e., total thickness of the base) before the bonding with the film is represented by t1, the total thickness of the first wiring and the base after the bonding with the film is represented by t'1, the total thickness of the second wiring and the film (i.e., total thickness of the film) before the bonding with the base is represented by t2, the total thickness of the second wiring and the film after the bonding with the base is represented by t'2, the thickness of the adhesive agent layer before the bonding is represented by tAdh, and the thickness of each of the elements or the like is represented by tD, the following relationship may be satisfied:

$$t1+t2+tAdh \approx t'1+t'2+tD \qquad (1)$$

In formula (1), $t'1 \leq t1$, $t'2 < t2$, and $tAdh < tD$ are satisfied. Furthermore, preferably, $t'1 < t'2$ is satisfied. Herein, each of the thicknesses t'1 and t'2 is a thickness of a portion or an area that is in contact with an element or the like.

In the description below, the base may be referred to as "base for mounting" and the film may be referred to as "film for mounting".

Here, when $\Delta t = tD - tAdh$, formula (1) can be changed to formula (1'):

$$t1+t2 \approx t'1+t'2+\Delta t \qquad (1')$$

That is, at least one of the base for mounting and the film for mounting after bonding is preferably deformed so that, when the base for mounting and the film for mounting are bonded with an adhesive agent layer in a state in which a tensile force is applied to the film for mounting (a tensile stress is present in the film for mounting), the sum of the thickness t'1 of the base for mounting including the thickness of the first wiring and the thickness t'2 of the film for mounting including the thickness of the second wiring is smaller than the sum of the total layer thickness t1 of the original base for mounting including the thickness of the first wiring and the total layer thickness t2 of the original film for mounting including the thickness of the second wiring by approximately $\Delta t$. The value of (t1+t2) is roughly equal to the value of (t'1+t'2+$\Delta t$). However, more specifically, formula (1') means that the relationship $0.9 \leq (t1+t2)/(t'1+t'2+\Delta t) \leq 1.1$ is satisfied.

In an embodiment, for example, when the base for mounting is composed of a film, the thicknesses and/or the moduli of elasticity of the film for mounting and the film constituting the base for mounting are preferably different from each other so as to optimize the values of t'1 and t'2. In such a case, the width of the wiring of one of the films having a larger thickness with a larger deformation or having a lower modulus of elasticity is preferably designed so as to be larger than the width of each element or the like, thereby forming a structure that imparts a light extraction function to the wiring (for example, a structure in which the wiring also functions as a light extraction mirror). On the other hand, the width of the wiring of the other film having a smaller thickness with a smaller deformation or having a higher modulus of elasticity is preferably designed so as to be smaller than the width of each element or the like, thereby allowing light to be emitted from the side of the film.

When elements or the like are sandwiched between a base for mounting and a film for mounting so that a second connecting portion of each of the elements or the like is in contact with a second wiring and a tensile force is applied to the film for mounting, in order to prevent air bubbles from being generated or mixed, for example, the elements or the like are preferably sandwiched between the base for mounting and the film for mounting in a vacuum atmosphere. Alternatively, the elements or the like are preferably sandwiched between the base for mounting and the film for mounting using a dry laminator. Examples of a method of bonding the base to the film with an adhesive agent layer include a method in which a laminating press device including a heating unit is used and a method in which a laminating roller device including a heating unit is used.

In the electronic device according to an embodiment and the method of producing the same, examples of the elements include not only a light-emitting diode (LED) but also other light-emitting elements such as a semiconductor laser and an electroluminescent (EL) element; light-receiving elements such as a photodiode, a CCD sensor, and a MOS sensor; and electronic elements such as an IC chip and an LSI chip. In addition to semiconductor elements (such as light-emitting elements, light-receiving elements, and electron transit elements), examples of the elements include piezoelectric elements, pyroelectric elements, optical elements (such as second harmonic wave-generating elements using nonlinear optical crystals), dielectric elements (including ferroelectric elements), and superconducting elements. Furthermore, examples of the elements also include fine components and elements that are used for various micro electro mechanical systems (MEMS) such as an optical encoder.

The dimension (for example, the chip size) of the element or the like is also not particularly limited. The element or the like typically has a very small size. More specifically, the element or the like has a dimension of, for example, 1 mm or less, 0.3 mm or less, or 0.1 mm or less. An electronic device (or a light-emitting diode display unit) includes a plurality of elements or the like. For example, the number, the type, the mounting (arrangement), and the interval of the elements or the like are determined in accordance with the application and the functions of the electronic device, the specification required for the electronic device or the light-emitting diode display unit, and the like.

In an embodiment, examples of the film for mounting include a polyethersulfone (PES) film, a polyethylene naphthalate (PEN) film, a polyimide (PI) film, and a polyethylene terephthalate (PET) film. Examples of the base for mounting include the above various films; a glass substrate; a substrate prepared by bonding the above film to a glass substrate; a glass substrate having a polyimide resin layer, an acrylic resin layer, a polystyrene resin layer, or a silicone rubber layer thereon. Alternatively, the glass substrate may be replaced with a metal substrate or a plastic substrate.

In the light-emitting diode display unit according to an embodiment or the method of producing the same, each of a plurality of first wirings has a strip shape as a whole and extends in a first direction. Each of a plurality of second wirings has a strip shape as a whole and extends in a second direction different from the first direction (for example, in a direction orthogonal to the first direction). The wiring having a strip shape as a whole may be composed of a main wiring having a strip shape and a plurality of branch wirings each extending from the main wiring.

In the electronic device according to an embodiment and the method of producing the same, the first wiring is composed of a plurality of wirings, and each of the wirings extends in a first direction as a whole. The second wiring is also composed of a plurality of wirings, and each of the wirings extends in a second direction different from the first direction (for example, in a direction orthogonal to the first direction) as a whole. Alternatively, the first wiring may be composed of a common wiring (common electrode), the second wiring may be composed of a plurality of wirings, and each of the wirings may extend in one direction as a whole. Alternatively, the first wiring may be composed of a plurality of wirings, each of the wirings may extend in one direction as a whole, and the second wiring may be composed of a common wiring (common electrode). Alternatively, the first wiring may be composed of a common wiring (common electrode), and the second wiring may also be composed of a common wiring (common electrode). The wiring may be composed of, for example, a main wiring and a plurality of branch wirings each extending from the main wiring.

Examples of the materials of the first wiring and the second wiring include metals such as gold (Au), silver (Ag), copper (Cu), palladium (Pd), platinum (Pt), chromium (Cr), nickel (Ni), aluminum (Al), tantalum (Ta), tungsten (W), titanium (Ti), indium (In), and tin (Sn); alloys containing these metal elements; conductive particles made of any one of these metals; and conductive particles made of an alloy containing these metal elements. Alternatively, each of the first wiring and the second wiring may have a laminated structure including layers containing these elements. Examples of the materials of the first wiring and the second wiring also include organic materials (conductive polymers) such as poly(3,4-ethylenedioxythiophene)/polystyrene sulfonic acid (PEDOT/PSS). The method of forming the first wiring and the second wiring depends on the material constituting these wirings. Examples of the method include physical vapor deposition methods (PVD methods); chemical vapor deposition methods (CVD methods) such as a metalorganic chemical vapor deposition (MOCVD) method; a spin coating method; printing methods such as a screen printing method, an ink jet printing method, an offset printing method, and a gravure printing method; coating methods such as an air doctor coating method, a blade coating method, a rod coating method, a knife coating method, a squeeze coating method, a reverse roll coating method, a transfer roll coating method, a gravure coating method, a kiss coating method, a cast coating method, a spray coating method, a slit orifice coating method, a calender coating method, and an immersion method; a stamping method; a lift-off method; a shadow mask method; plating methods such as an electrolytic plating method, an electroless plating method, and a combination of these; and a spray method. These methods may be employed in combination with a patterning technique according to need. Examples of the PVD methods include (a) vacuum deposition methods such as an electron beam heating method, a resistance heating method, and a flash evaporation method; (b) a plasma-deposition method; (c) sputtering methods such as a bipolar sputtering method, a DC sputtering method, a DC magnetron sputtering method, an RF sputtering method, a magnetron sputtering method, an ion beam sputtering method, and a bias sputtering method; and (d) ion plating methods such as a direct current (DC) method, an RF method, a multi-cathode method, an activated reactive method, an electric field evaporation method, an RF ion plating method, and a reactive ion plating method. The material of the first wiring and the material of the second wiring may be the same or different.

In an embodiment, the phrase "a film for mounting is flexible" means that, in a state in which a tensile force is applied to a film for mounting (in a state in which a tensile stress is present in the film for mounting), the film for mounting is flexible to the extent that elements or the like can be sandwiched between a base for mounting and the film for mounting. The adhesive agent layer may be provided on the film for mounting in some cases. Alternatively, the adhesive agent layer may be provided on both the film for mounting and the base for mounting.

Examples of the material of the insulating film include inorganic insulating materials such as silicon oxide materials, silicon nitrides (SiNY), and metal oxide high dielectric insulating films; and organic insulating materials such as polymethyl methacrylate (PMMA), polyvinylphenol (PVP), and polyvinyl alcohol (PVA). These materials may be used in combinations. Examples of the silicon oxide materials include silicon oxides ($SiO_X$), silicon oxynitride (SiON), spin on glass (SOG), and low-dielectric constant $SiO_X$ materials (such as polyaryl ethers, cycloperfluorocarbon polymers, benzocyclobutene, cyclic fluorocarbon resins, polytetrafluoroethylene, fluorinated aryl ethers, fluorinated polyimides, amorphous carbon, and organic SOG). Examples of a method of forming the insulating film include the above-mentioned PVD methods, CVD methods, a spin coating method, the above-mentioned printing methods, the above-mentioned coating methods, an immersion method, a casting method, and a spray method.

Examples of the material of the black matrix layer include carbon, thin films of a metal (such as chromium, nickel, aluminum, molybdenum, or an alloy thereof), a metal oxide (such as chromium oxide), a metal nitride (such as chromium nitride), heat-resistant organic resins, glass paste, and glass paste containing conductive particles such as a black pigment or silver particles. The black matrix layer can be formed by a method that is appropriately selected in accordance with the material used. For example, the black matrix layer can be formed by combining a vacuum deposition method or a sputtering method and an etching method; combining a vacuum deposition method, a sputtering method, or a spin coating method and a lift-off method; a printing method; or a lithography technique. Examples of the material of the convex lens include acrylic resins, epoxy resins, and silicone rubbers. Examples of a method of forming (disposing) the convex lens include a reflow method, a potting method, an imprint method, a photolithography method, an etching method, and a printing method.

A specific method of arranging elements or the like on a base for mounting and a specific method of arranging elements or the like on an adhesive agent layer will be described below. In an electronic device, a plurality of elements may be arranged on a base for mounting regularly or irregularly. The elements may be arranged on an adhesive agent layer regularly or irregularly. In contrast, in a light-emitting diode display unit, a plurality of light-emitting diodes are arranged on a base for mounting regularly and arranged on an adhesive agent layer regularly.

In an embodiment including preferred structures described above, examples of the material of the adhesive agent layer include materials that exhibit an adhesive function by being irradiated with energy rays such as light (in particular, for example, ultraviolet rays), radiation rays (such as X rays), or an electron beam; and materials that exhibit an adhesive function by being subjected to heat, pressure, or the like. The material of the adhesive agent layer is not particularly limited as long as the materials exhibit an adhesive function using any method. Examples of the materials that can be easily formed into the adhesive agent layer and that can exhibit an adhesive function include resin adhesive agent layers, in particular, layers made of a photosensitive adhesive agent, a thermosetting adhesive agent, and a thermoplastic adhesive agent. Examples of the photosensitive adhesive agent include known photosensitive adhesive agents. Specific examples thereof include negative-type photosensitive adhesive agents, such as polyvinyl cinnamate and polyvinyl azidobenzal, in which exposed portions become hardly soluble in a developing solution by a photocrosslinking reaction, and acrylamide in which exposed portions become hardly soluble in a developing solution by a photopolymerization reaction; and positive-type photosensitive adhesive agents, such as o-quinonediazide-novolak resins, in which a quinonediazide group produces a carboxylic acid by a photodegradation and the resins become easily soluble in a developing solution. Examples of the thermosetting adhesive agent include known thermosetting adhesive agents. Specific examples thereof include epoxy resins, phenolic resins, urea resins, melamine resins, unsaturated polyester resins, polyurethane resins, and polyimide resins. Furthermore, examples of the thermoplastic adhesive agent include known thermoplastic adhesive agents. Specific examples thereof include polyethylene resins, polystyrene resins, polyvinyl chloride resins, and polyamide resins. For example, when a photosensitive adhesive agent is used, an adhesive function can be imparted to the adhesive agent layer by irradiating the adhesive agent layer with light or ultraviolet rays. When a thermosetting adhesive agent is used, an adhesive function can be imparted to the adhesive agent layer by heating the adhesive agent layer with a hot plate, an oven, a heat press device, a heat roller, or the like. When a thermoplastic adhesive agent is used, an adhesive function can be imparted to the adhesive agent layer by selectively heating a part of the adhesive agent layer by, for example, irradiation of light to melt the part and impart flowability, and then cooling the adhesive agent layer. In addition, other examples of the adhesive agent layer include pressure-sensitive adhesive agent layers (made of an acrylic resin or the like) and layers that originally have an adhesive function and exhibit the adhesive function by only forming a layer without further process.

Examples of the electronic device include a light-emitting diode display unit, a backlight including light-emitting diodes, a light-emitting diode lighting system, and an EL display unit. The electronic device is not particularly limited and may be a portable electronic device or a non-portable electronic device. Specific examples thereof include a cell phone, a mobile device, a robot, a personal computer, a device for automobile use, and a home electric appliance. For example, a diode composed of a nitride-based III-V group compound semiconductor can be used as a red-light-emitting diode, a green-light-emitting diode, and a blue-light-emitting diode. For example, a diode composed of an AlGaInP compound semiconductor can be used as a red-light-emitting diode.

At present, it is difficult to produce a substrate having a large diameter exceeding nominal 2 inches as a substrate for element production on which GaInN light-emitting diodes are produced. It is also difficult to produce a substrate having a large diameter exceeding nominal 3 inches as a substrate for element production on which AlGaInP light-emitting diodes are produced. Accordingly, for example, blue-light-emitting diodes and green-light-emitting diodes are produced using a sapphire substrate having a diameter of nominal 2 inches as a substrate for element production, and red-light-emitting diodes are produced using a GaAs substrate having a diameter of nominal 3 inches as a substrate for element production. For example, when a light-emitting diode display unit having a diagonal of 26 inches is produced, it is necessary to mount blue-light-emitting diodes, green-light-emitting diodes, and red-light-emitting diodes on a substrate for a display unit having dimensions of 650 mm×550 mm.

In order to produce such a light-emitting diode display unit, when the above-described step transfer method is employed, it is necessary to move (for example, transfer) light-emitting diodes from a substrate for element production to a base for mounting, for example, no less than 24×10×(three types of light-emitting diodes)=720 times. In a single movement (transfer), a plurality of light-emitting diodes are moved (transferred). The number of times the light-emitting diodes are moved will be described below in detail. Accordingly, a mounting device having a high accuracy and a high throughput is necessary, resulting in not only an increase in the production cost of the light-emitting diode display unit but also difficulty of the production of the light-emitting diode display unit.

According to an embodiment, for example, there is provided a method including the steps of (1) preparing a plurality of element intermediate structures in which an element intermediate for obtaining elements or the like by being separated in a subsequent step is formed on a substrate for element production; (2) temporarily fixing the element intermediate in each of the plurality of element intermediate structures on a substrate for temporary fixing; (3) removing the substrate for element production included in each of the plurality of element intermediate structures from the element intermediate; (4) separating the element intermediate that is temporarily fixed on the substrate for temporary fixing, thereby obtaining a plurality of elements or the like; and (5) arranging the plurality of elements or the like that are temporarily fixed on the substrate for temporary fixing onto a base for mounting.

Step (5) above may include the steps of (5-1) temporarily fixing a plurality of predetermined elements or the like that have been temporarily fixed on the substrate for temporary fixing on a relay substrate; and (5-2) arranging the elements or the like that are temporarily fixed on the relay substrate onto the base for mounting.

An example of a method of temporarily fixing a plurality of predetermined elements or the like that have been temporarily fixed on the substrate for temporary fixing on a relay substrate is a method of allowing the elements or the like to be adhered to a slightly pressure-sensitive layer formed on the relay substrate in advance. A specific method of arranging the elements or the like that have been temporarily fixed on the relay substrate on the base for mounting or a method of arranging (moving or transferring) the elements or the like on the adhesive agent layer of the base for mounting will be described below.

In this case, in step (5-2), more specifically, after the elements or the like that have been temporarily fixed on the relay substrate are arranged (moved or transferred) on the adhesive agent layer, the elements or the like are preferably brought into contact with the first wiring.

The shape, the configuration, and the structure of the element intermediate depend on the type of elements or the like, but an example of the element intermediate is a thin film. The substrate for element production is not particularly limited as long as the substrate is suitable for producing elements or the like thereon. For example, when the elements are blue-light-emitting diodes or green-light-emitting diodes, a sapphire substrate can be used as the substrate for element production. For example, when the elements are red-light-emitting diodes, a GaAs substrate can be used as the substrate for element production. That is, when the former substrate for element production is used, the element intermediate is a laminate including GaInN compound semiconductor layers. When the latter substrate for element production is used, the element intermediate is a laminate including AlGaInP compound semiconductor layers. The method of producing the element intermediate can be determined in accordance with the type of elements or the like. The number of elements or the like that are finally obtained from the substrate for element production and the number of element intermediate structures can be appropriately determined from the number of elements or the like included in an electronic device or a light-emitting diode display unit.

Examples of the material of the substrate for temporary fixing or a supporting substrate described below include a glass plate, a metal plate, an alloy plate, a ceramic plate, and a plastic plate. Examples of a method of fixing a plurality of substrates for temporary fixing to the supporting substrate and a method of temporarily fixing the element intermediates of the element intermediate structures to the substrate for temporary fixing include a method using an adhesive agent, a metal joining method, a semiconductor joining method, and a metal-semiconductor joining method. Examples of a method of removing the substrate for element production from the element intermediates include a laser ablation method, a heating method, and an etching method. Examples of a method of separating a plurality of element intermediates include a wet etching method, a dry etching method, a laser irradiation method, and a dicing method.

In the electronic device or the light-emitting diode display unit according to an embodiment, each element or the like is sandwiched between a base and a film in a state in which a first connecting portion of the element or the like is in contact with a first wiring, a second connecting portion thereof is in contact with a second wiring, and a tensile force is applied to the film. Furthermore, in this state, the base and the film are bonded with an adhesive agent layer. In the method of producing an electronic device or a method of producing a light-emitting diode display unit according to an embodiment of the present application, an element or the like is sandwiched between a base and a film so that a second connecting portion of the element or the like is in contact with a second wiring and a tensile force is applied to the film, and the base and the film is bonded with an adhesive agent layer while this state is maintained. Accordingly, unlike the related art, wirings need not be formed after the elements or the like are mounted on a substrate for a display unit. This method does not include many steps, for example, a step of forming wirings after the mounting of elements or the like on the substrate for a display unit is not necessary. Consequently, connecting portions provided on the elements or the like can be connected to the wirings reliably and relatively easily with high reliability.

In the method of producing an electronic device or the method of producing a light-emitting diode display unit according to a preferred embodiment, element intermediates are temporarily fixed on a substrate for temporary fixing, a substrate for element production is removed from the element intermediates, and a plurality of element intermediates that are temporarily fixed on the substrate for temporary fixing are then separated to obtain individual elements or the like. Accordingly, the state after the elements or the like are obtained is equivalent to a state in which the elements or the like are produced as if a substrate for temporary fixing having a size several times larger than a substrate for element production (a size corresponding to the size of several substrates for element production) acted as a substrate for element production. Accordingly, the elements or the like need not be moved (for example, transferred) from the substrate for element production. The number of times the elements or the like are moved (for example, transferred) from the substrate for temporary fixing to a base for mounting can be decreased. Furthermore, when the elements or the like are obtained by separating the element intermediates, a high positional accuracy can be achieved compared with the case where the elements or the like are arranged after separation. Accordingly, the elements or the like can be moved (for example, transferred) from the substrate for temporary fixing to the base for mounting without using a mounting device having a high accuracy and a high throughput. As a result, an increase in the production cost of the elements or the like does not occur, and the production of a unit on which a large number of elements or the like are mounted or a light-emitting diode display unit can be easily performed.

The elements or the like are obtained by separating a plurality of element intermediates that are temporarily fixed on the substrate for temporary fixing. Therefore, the positional accuracy of the elements or the like remaining on the substrate for temporary fixing after separation depends on the processing accuracy for separating the element intermediates and does not depend on the positional accuracy when the element intermediates are temporarily fixed on the substrate for temporary fixing. Accordingly, the element intermediates can be moved from the substrate for element production to the substrate for temporary fixing without using a mounting device having a high accuracy and a high throughput.

Additional features and advantages are described herein, and will be apparent from, the following Detailed Description and the figures.

BRIEF DESCRIPTION OF THE FIGURES

FIGS. 4A to 4C are schematic partial end views of elements or the like illustrating a method of producing an electronic device or a method of producing a light-emitting diode display unit of the first embodiment;

FIGS. 10A and 10B are schematic plan views of the elements or the like after processing shown in FIG. 9B has been performed in the method of producing an electronic device or the method of producing a light-emitting diode display unit of the second embodiment;

DETAILED DESCRIPTION

The present application will now be described using embodiments with reference to the drawings.

First Embodiment

A first embodiment relates to an electronic device according to an embodiment of the present application and a method to producing the same, and a light-emitting diode display unit according to an embodiment and a method of producing the same. In the first embodiment, a light-emitting diode is used as an element. Therefore, in the descriptions below, the term "light-emitting diode" may be used instead of the term "element". Accordingly, when the term "light-emitting diode is used in the descriptions below, the term includes a concept of an "element" in principle.

Figure 1A:
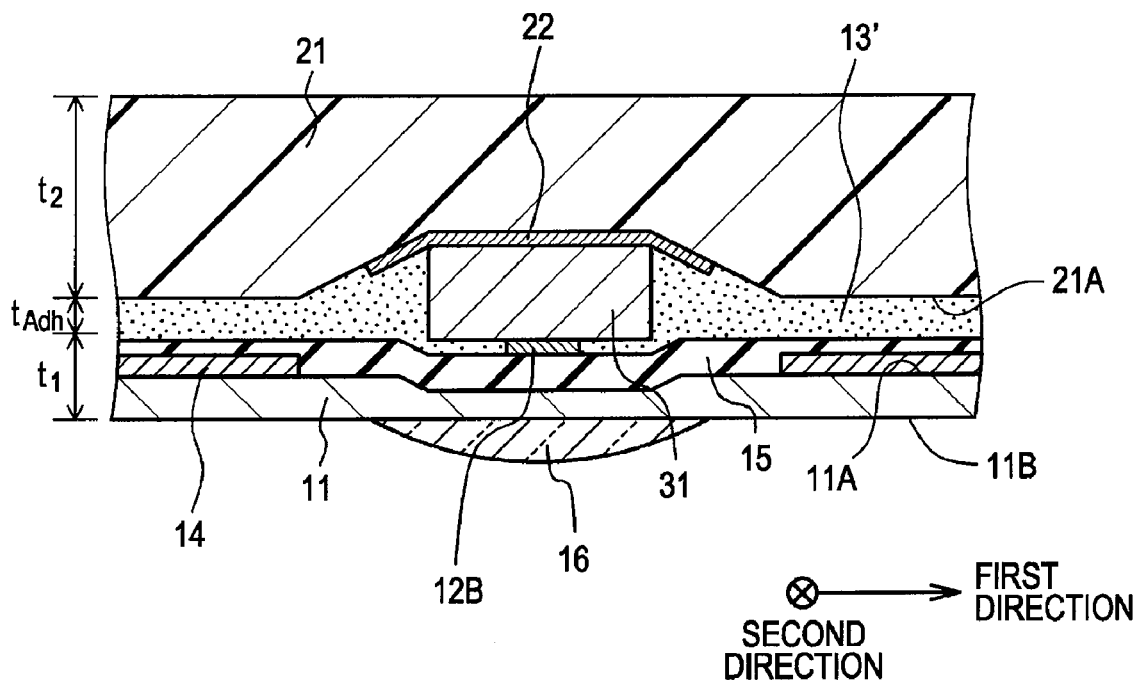
FIG. 1A is a schematic partial cross-sectional view of an electronic device or a light-emitting diode display unit according to a first embodiment.
Figure 1B:
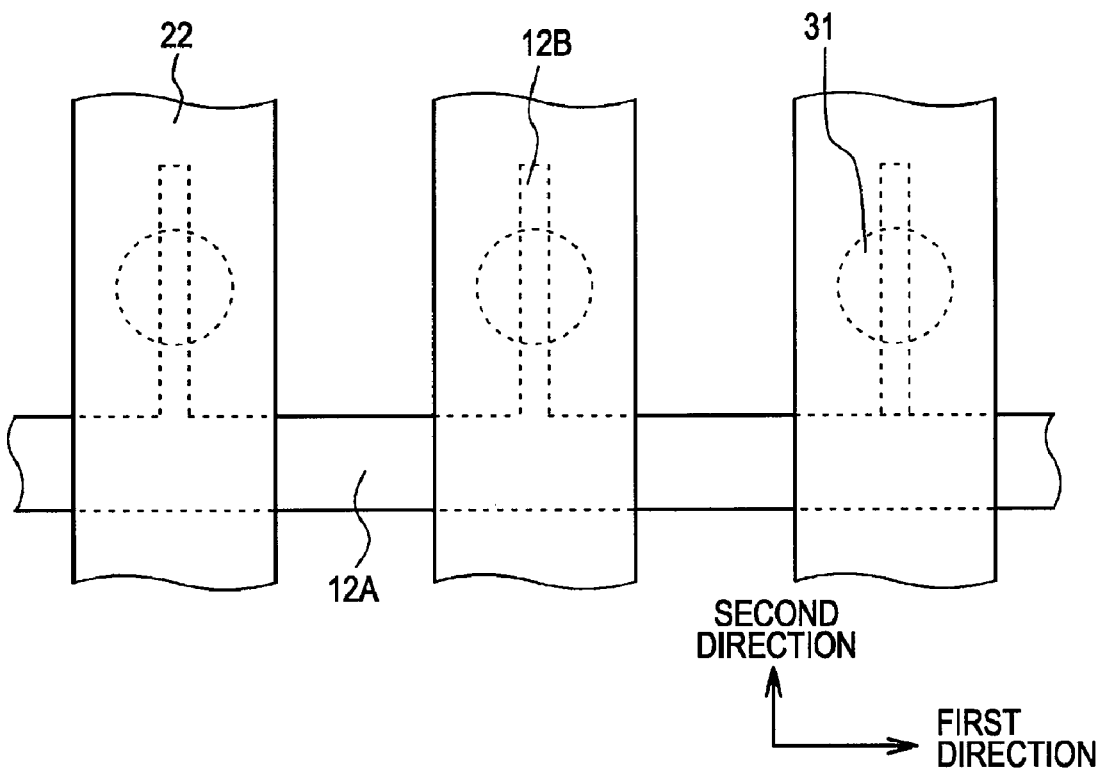
FIG. 1B is a view showing the layout of a first wiring and a second wiring according to the first embodiment.
Figure 2A:
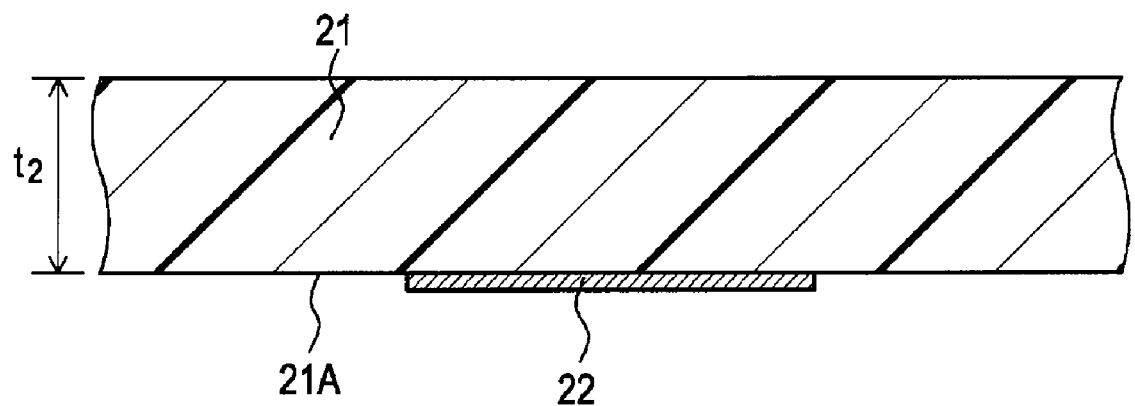
FIG. 2A is a schematic partial cross-sectional view of a film for mounting according to the first embodiment.
Figure 2B:
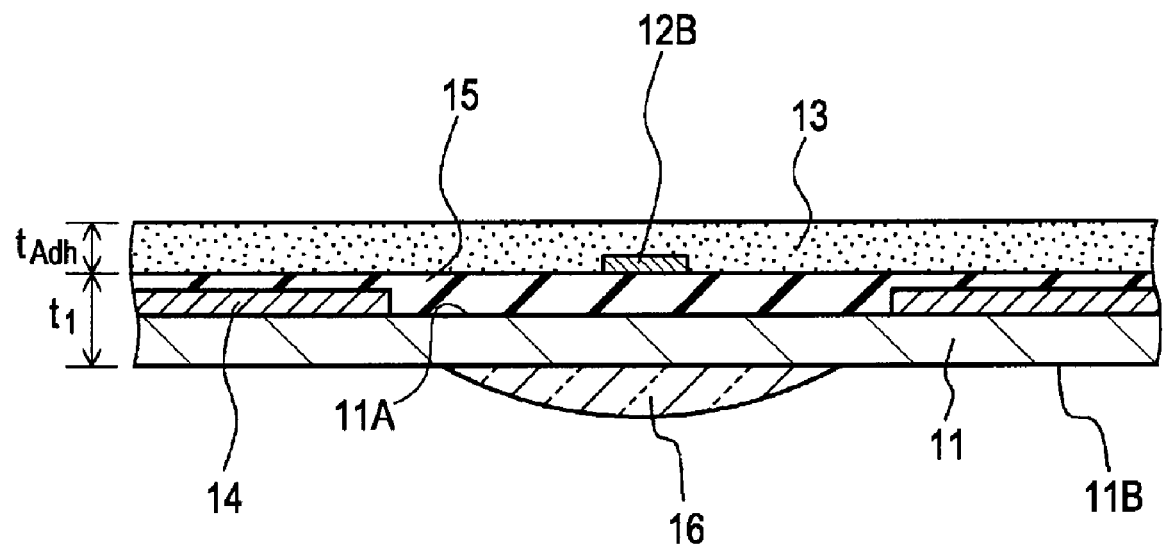
FIG. 2B is a schematic partial cross-sectional view of a base for mounting according to the first embodiment.
Figure 3A:
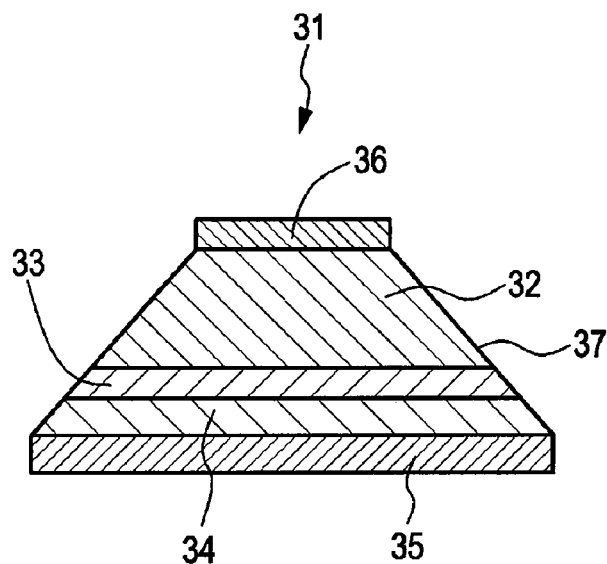
FIG. 3A is a schematic cross-sectional view of an element (light-emitting diode)
Figure 3B:
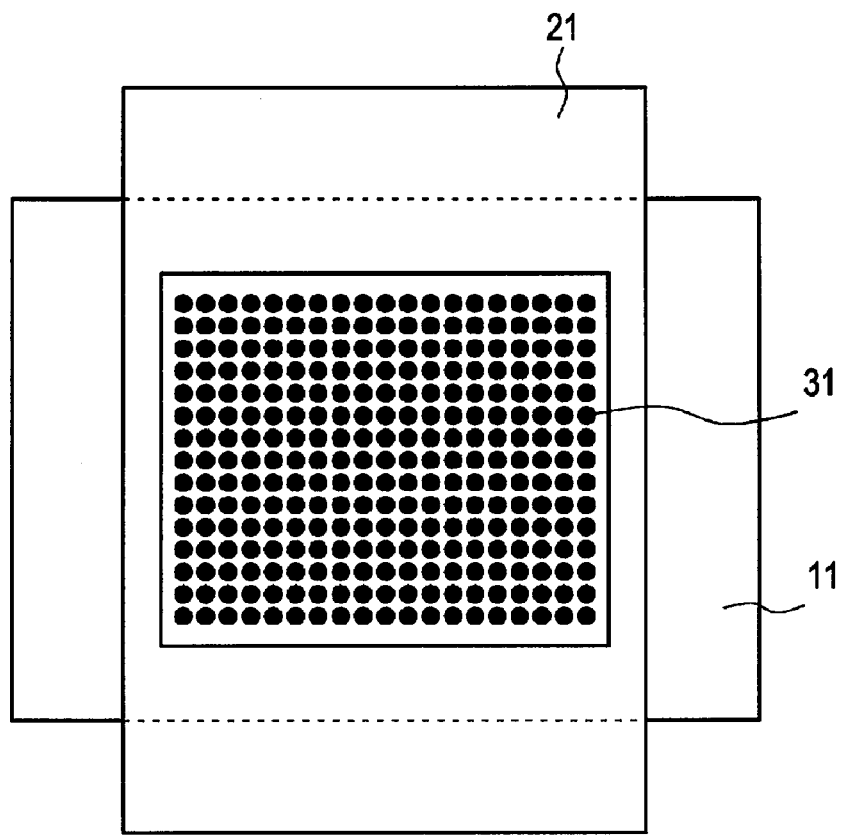
FIG. 3B is a schematic view showing a state in which the film for mounting is bonded to the base for mounting, as viewed from above.

FIG. 1A is a schematic partial cross-sectional view of an electronic device or a light-emitting diode display unit according to the first embodiment. FIG. 1B shows the layout of a first wiring and a second wiring. FIG. 2A is a schematic partial cross-sectional view of a film for mounting. FIG. 2B is a schematic partial cross-sectional view of a base for mounting. FIG. 3A is a schematic cross-sectional view of an element (light-emitting diode) 31. FIG. 3B is a schematic view showing a state in which the film for mounting is bonded to the base for mounting, as viewed from above. In the first embodiment, a light-emitting diode display unit having a diagonal of 13 inches is produced. Therefore, light-emitting diodes whose number is 1,920×1,080×(the number of types of light-emitting diodes required for forming a single pixel, i.e., 3) are mounted on an area of 300 mm×200 mm.

The electronic device of the first embodiment includes (A) a base for mounting 11 having a first wiring 12 thereon, (B) a flexible film for mounting 21 having a second wiring 22 thereon, (C) a plurality of elements 31 each including a first connecting portion 35 and a second connecting portion 36, and (D) an adhesive agent layer 13'.

The light-emitting diode display unit of the first embodiment includes (A) a base for mounting 11 having a plurality of first wirings 12 thereon, (B) a flexible film for mounting 21 having a plurality of second wirings 22 thereon, (C) a plurality of light-emitting diodes 31 each including a first connecting portion 35 and a second connecting portion 36, and (D) an adhesive agent layer 13'.

Each of the elements (light-emitting diodes) 31 is sandwiched between the base for mounting 11 and the film for mounting 21 in a state in which the first connecting portion 35 is in contact with the first wiring 12, the second connecting portion 36 is in contact with the second wiring 22, and a tensile force is applied to the film for mounting 21 (a tensile stress is present in the film for mounting 21). Furthermore, in this state, the base for mounting 11 is bonded to the film for mounting 21 with the adhesive agent layer 13'. Herein, an uncured adhesive agent layer is represented by reference numeral 13, and a cured adhesive agent layer is represented by reference numeral 13'.

In the electronic device of the first embodiment, the first wiring 12 is composed of a plurality of wirings. Each of the wirings has a strip shape as a whole and extends in a first direction. The second wiring 22 is also composed of a plurality of wirings. Each of the wirings has a strip shape as a whole and extends in a second direction different from the first direction. The first wiring 12 is composed of main wirings 12A each extending in a strip shape and a plurality of branch wirings 12B extending from each of the main wirings 12A.

As shown in the schematic partial cross-sectional view of FIG. 2B, the base for mounting 11 is composed of a PES film having a width of 300 mm, a nominal thickness of 10 µm, and a modulus of elasticity of 2×109 Pa (2 GPa). A black matrix layer 14 made of carbon is formed by a screen printing method on an area (rectangular area having dimensions of 300 mm×200 mm) which is disposed on an inner surface 11A of the base for mounting 11 facing the film for mounting 21 and on which the light-emitting diodes 31 are not provided. An insulating film 15 having a thickness of 1 µm is formed on a rectangular area that has dimensions of 300 mm×200 mm and that is disposed on the black matrix layer 14 and the inner surface 11A of the base for mounting 11. The outer shape of a portion for disposing a light-emitting diode 31 of the inner surface 11A of the base for mounting 11, the portion not having the black matrix layer 14 thereon, is a circular shape having a diameter of 30 µm. Furthermore, the first wiring 12 having a thickness of 0.5 µm and made of aluminum is formed on the insulating film 15 by a vacuum deposition method. The first wiring 12 is composed of the main wirings 12A each extending in a strip shape and a plurality of branch wirings 12B extending from each of the main wirings 12A. The number of main wirings 12A is 1,080, the width of each main wiring 12A is 100 µm, and the pitch of the main wirings 12A is 150 µm. The branch wirings 12B whose number is 1,920×3 and which each have a width of 2 µm extend from each of the main wirings 12A with a pitch of 50 µm. An adhesive agent layer 13 made of a thermosetting adhesive agent and having a thickness (tAdh) of 2 µm is formed on the insulating film 15 and the first wiring 12 by a spin coating method. The adhesive agent layer 13 may be formed by any method. Instead of an application method (such as a spin coating method), the adhesive agent layer 13 may be formed by, for example, a printing method (such as a contact printing method, an imprint method, a screen printing method, a gravure printing method, or an offset printing method). Furthermore, in order to increase the luminance in the forward direction by about two times, a convex lens 16 made of an acrylic resin is formed by a reflow method at a position which is disposed on an outer surface 11B of the base for mounting 11, the outer surface 11B being opposite the inner surface 11A of the base for mounting 11 facing the film for mounting 21, and to which light from the light-emitting diode 31 is emitted.

As shown in the schematic partial cross-sectional view of FIG. 2A, the film for mounting 21 is composed of a PES film having a width of 300 mm, a nominal thickness of 100 µm, and a modulus of elasticity of 2×109 Pa (2 GPa). The second wiring 22 made of aluminum is formed on an inner surface 21A of the film for mounting 21 facing the base for mounting 11 by a vacuum deposition method. The second wiring 22 is composed of 1,920×3 wirings, the width of each of the wirings is 40 µm, the pitch of the wirings is 50 µm, and the thickness thereof is 0.5 µm. The second wiring 22 also functions as a light extraction mirror.

FIG. 3A is a schematic cross-sectional view of the light-emitting diode 31. In the light-emitting diode 31, a first compound semiconductor layer 32 made of an n-type compound semiconductor, an active layer 33, and a second compound semiconductor layer 34 made of a p-type compound semiconductor are sequentially stacked. The first compound semiconductor layer 32, the active layer 33, and the second compound semiconductor layer 34 have, for example, circular planar shapes as a whole, and the light-emitting diode 31 has a truncated conical shape as a whole. A first connecting portion (p-side electrode) 35 having, for example, a circular shape is provided on the second compound semiconductor layer 34. A second connecting portion (n-side electrode) 36 having, for example, a circular shape is provided on the first compound semiconductor layer 32. More specifically, the compound semiconductors constituting the first compound semiconductor layer 32, the active layer 33, and the second compound semiconductor layer 34 are, for example, a GaInN compound semiconductor or an AlGaInP compound semiconductor.

When the light-emitting diode 31 is, for example, a GaN light-emitting diode, specific examples of the dimensions of the layers, the materials thereof, and the like are as follows. The first compound semiconductor layer 32 is composed of an n-type GaN layer having a thickness of 2.6 µm. The active layer 33 has a thickness of, for example, 0.2 µm and has a multiple quantum well (MQW) structure including InGaN well layers and GaN barrier layers. The second compound semiconductor layer 34 is composed of a p-type GaN layer having a thickness of 0.2 µm. When the GaN light-emitting diode is a blue-light-emitting diode, the indium (In) composition of the InGaN well layers in the active layer 33 is, for example, 0.17. When the GaN light-emitting diode is a green-light-emitting diode, the In composition of the InGaN well layers is, for example, 0.25. The maximum diameter of the light-emitting diode 31, that is, the diameter of the bottom surface of the second compound semiconductor layer 34 is 20 µm. The total thickness (tD) of the light-emitting diode 31 is 5 µm. The p-side electrode 35 is composed of, for example, metal multilayer films having a Ag/Pt/Au structure. Alternatively, the p-side electrode 35 may be a single layer film made of Ag. The n-side electrode 36 is composed of, for example, metal multilayer films having a Ti/Pt/Au structure. In this light-emitting diode 31, light generated from the active layer 33 during operation and light emitted from an end face 37 are reflected at the second wiring 22 and extracted to the outside through the base for mounting 11 and the convex lens 16.

The area of the light-emitting diode 31 is represented by SD. The effective modulus of elasticity of a single light-emitting diode 31 having an area SD is represented by E'D. The effective modulus of elasticity of the base for mounting 11 with an area SD when the base for mounting 11 is pressurized during bonding is represented by E'1. The effective modulus of elasticity of the film for mounting 21 with an area SD when the film for mounting 21 is pressurized at a pressure of P2 during bonding is represented by E'2. The modulus of elasticity of the adhesive agent layer 13' is represented by EAdh. The pressure applied to the light-emitting diode 31 during bonding is represented by P1. When relationships E'D>>E'1,
E'1=E'2,
EAdh>>P2,
E'1>>P2, and
E'2>>P2, are satisfied, the pressure P1 applied to the light-emitting diode 31 during bonding is represented by formula (2):

$$P1 = E'1 \times (tD - tAdh)/(t1 + t2) + P2 \quad (2)$$

Here, when relationships
E'1=5×109 Pa (5 GPa),
tD−tAdh=3 μm,
t1+t2=110 μm, and
P2=1×106 Pa (1 MPa, about 10 kgf/cm2)
are satisfied,
P1=1.4×108 Pa.

When a stress is represented by T and a strain is represented by ε, the Young's modulus E is represented by $$E = T/\epsilon.$$

For example, a stress generated when films having the same effective modulus of elasticity of E'1=E'2 are deformed in a state in which the films sandwich the light-emitting diode 31 is the same as a stress generated when a film having a thickness of (t1+t2), that is, a film prepared by integrating these films is deformed. Accordingly, the total of the strains ε due to the film deformation is calculated by dividing the amount of deformation (tD−tAdh) by the original total thickness (t1+t2), i.e., (tD−tAdh)/(t1+t2). On the other hand, E in the above formula can be substituted with the effective modulus of elasticity E'1 of the film. Accordingly, a stress T caused when films having the same effective modulus of elasticity of E'1=E'2 are subjected to the above strains ε is represented by $$E'1 \times (tD - tAdh)/(t1 + t2).$$

In addition, the pressure P1 applied to the light-emitting diode 31 is represented by (T+P2). Accordingly, formula (2) above is obtained. Although the first wiring 12 and the second wiring 22 are provided, the wirings 12 and 22 having a very small thickness are easily subjected to plastic deformation. Accordingly, it is believed that the wirings 12 and 22 do not significantly affect elastic deformation.

That is, in each light-emitting diode 31, the pressure P1 applied to the light-emitting diode 31 during bonding, which is an important factor for reliably bringing the first connecting portion 35 into contact with the first wiring 12 and for reliably bringing the second connecting portion 36 into contact with the second wiring 22, depends on the effective modulus of elasticity E'1 of the base for mounting 11, the effective modulus of elasticity E'2 of the film for mounting 21, the total thickness t1 of the base for mounting 11, the total thickness t2 of the film for mounting 21, the thickness tAdh of the adhesive agent layer, and the thickness tD of the light-emitting diode 31 and is not affected by the pressure P2 applied to the film for mounting 21 during bonding and variations thereof. Accordingly, a uniform load can be applied to all the elements (light-emitting diodes 31) even in a large area. As a result, wirings and connecting portions can be stably electrically connected.

A method of producing the electronic device and a method of producing the light-emitting diode display unit of the first embodiment will now be described with reference to FIGS. 4A to 4C, FIGS. 5A and 5B, FIGS. 6A and 6B, FIGS. 7A and 7B, and FIG. 8, which are schematic partial end views of the elements or the like. In a base for mounting 11 shown in FIG. 7B and FIG. 8, only the base for mounting 11 and an adhesive agent layer 13 are shown, and a first wiring 12, a black matrix layer 14, an insulating film 15, and a convex lens 16 are omitted.

Figure 5A:
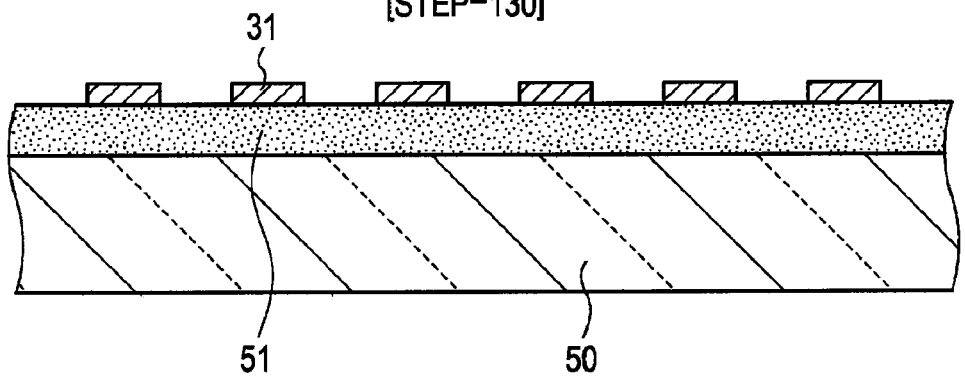
FIGS. 5A and 5B are schematic partial end views of the elements or the like after processing shown in FIG. 4C has been performed in the method of producing an electronic device or the method of producing a light-emitting diode display unit of the first embodiment.
Figure 5B:
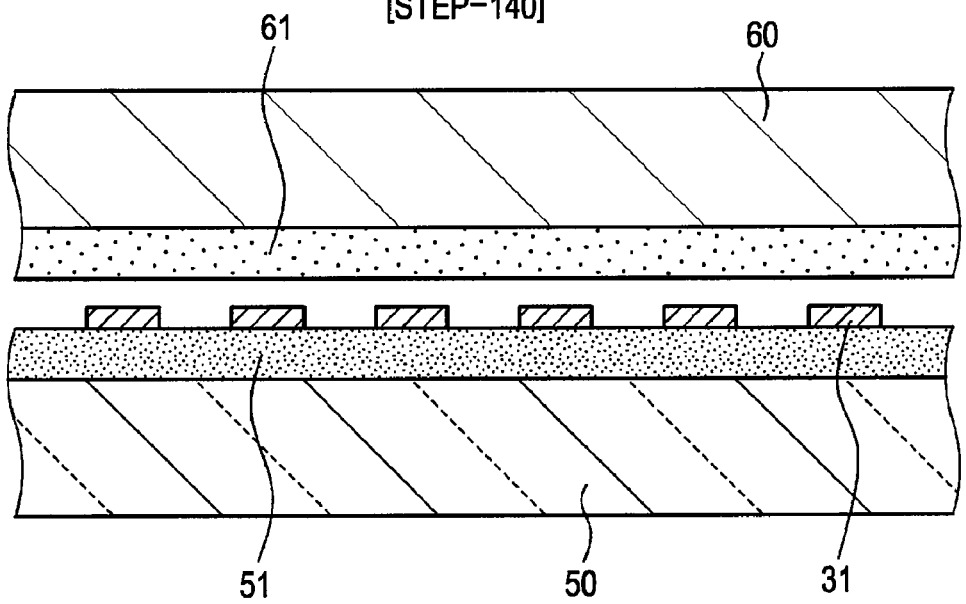

In the method, a relay substrate 60 having a slightly pressure-sensitive layer 61 made of a silicone rubber thereon is prepared (see FIG. 5B). A black matrix layer 14 is used as an alignment mark.

[Step-100]

First, an element intermediate structure 40 on which an element intermediate 42 for obtaining light-emitting diodes 31 by being separated in a subsequent step is provided on a substrate for element production 41 is prepared (produced) by a known method (see FIG. 4A). More specifically, for example, a first compound semiconductor layer 32 of an n-conductivity type, an active layer 33, and a second compound semiconductor layer 34 of a p-conductivity type are sequentially formed on a sapphire substrate (substrate for element production 41) having a nominal diameter of 2 inches by an MOCVD method. Furthermore, a first connecting portion (p-side electrode 35) is formed on the second compound semiconductor layer 34 by a vacuum deposition method. Thus, the element intermediate structure 40 can be produced in which the element intermediate 42 having a laminated structure including the first compound semiconductor layer 32, the active layer 33, the second compound semiconductor layer 34, and the p-side electrode 35 is provided on the substrate for element production 41. In the figure, the element intermediate 42 is shown as a single layer.

[Step-110]

Subsequently, the element intermediate 42 of the single element intermediate structure 40 is temporarily fixed on a substrate for temporary fixing 50. More specifically, the substrate for temporary fixing 50, which is a glass substrate having an adhesive layer 51 composed of an uncured adhesive agent thereon is prepared. The element intermediate 42 (more specifically, the p-side electrode 35) of the element intermediate structure 40 is then bonded to the adhesive layer 51, and the adhesive layer 51 is cured. Thus, the element intermediate structure 40 is temporarily fixed on the substrate for temporary fixing 50 (see FIG. 4B).

[Step-120]

Subsequently, the substrate for element production 41 included in the element intermediate structure 40 is removed from the element intermediate 42 (see FIG. 4C). More specifically, the interface between the element intermediate 42 (more specifically, the first compound semiconductor layer 32) and the substrate for element production 41 is irradiated with an excimer laser via the substrate for element production 41. As a result, laser ablation occurs, thus separating the substrate for element production 41 from the element intermediate 42.

[Step-130]

Figure 5C:
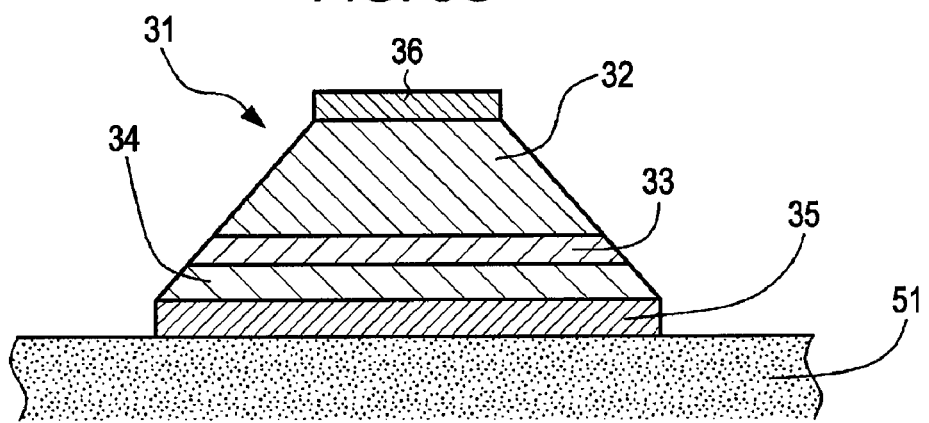
FIG. 5C is a schematic partial enlarged cross-sectional view of a light-emitting diode obtained in [Step-130]

Subsequently, the element intermediate 42 that is temporarily fixed on the substrate for temporary fixing 50 is separated, thus allowing a plurality of light-emitting diodes 31 to be obtained (see FIG. 5A). More specifically, a second connecting portion (n-side electrode 36) is formed on the first compound semiconductor layer 32. The element intermediate 42 is then etched using a photolithography technique and an etching technique, thereby allowing the plurality of light-emitting diodes 31 to be obtained. FIG. 5C is a schematic partial enlarged cross-sectional view of the light-emitting diode 31. The light-emitting diodes 31 remain on the substrate for temporary fixing 50 in an array (two-dimensional matrix shape). The planar shape of each of the light-emitting diodes 31 is a circular shape having a diameter of 20 µm.

Examples of the material of the substrate for temporary fixing 50 include not only a glass substrate but also a metal plate, an alloy plate, a ceramic plate, and a plastic plate. Examples of a method of temporarily fixing the element intermediate 42 of the element intermediate structure 40 to the substrate for temporary fixing 50 include not only a method using an adhesive agent but also a metal joining method, a semiconductor joining method, and a metal-semiconductor joining method. Examples of a method of removing the substrate for element production 41 from the element intermediate 42 include not only a laser ablation method but also a heating method, and an etching method. Examples of a method of separating a plurality of element intermediates 42 include a wet etching method, a dry etching method, a laser irradiation method, and a dicing method.

Subsequently, the light-emitting diodes 31 that are temporarily fixed on the substrate for temporary fixing 50 are arranged by the following method so that the first connecting portion 35 is in contact with the first wiring 12 on the base for mounting 11. More specifically, predetermined light-emitting diodes 31 are transferred from being disposed on the substrate for element production 41 on which a plurality of light-emitting diodes 31 are formed to being adhered to a relay substrate 60. The light-emitting diodes 31 adhered to the relay substrate 60 are arranged on an adhesive agent layer 13. Each of the light-emitting diodes 31 is then arranged on a base for mounting 11 so that the first connecting portion 35 is in contact with the first wiring 12.

[Step-140]

Figure 6A:
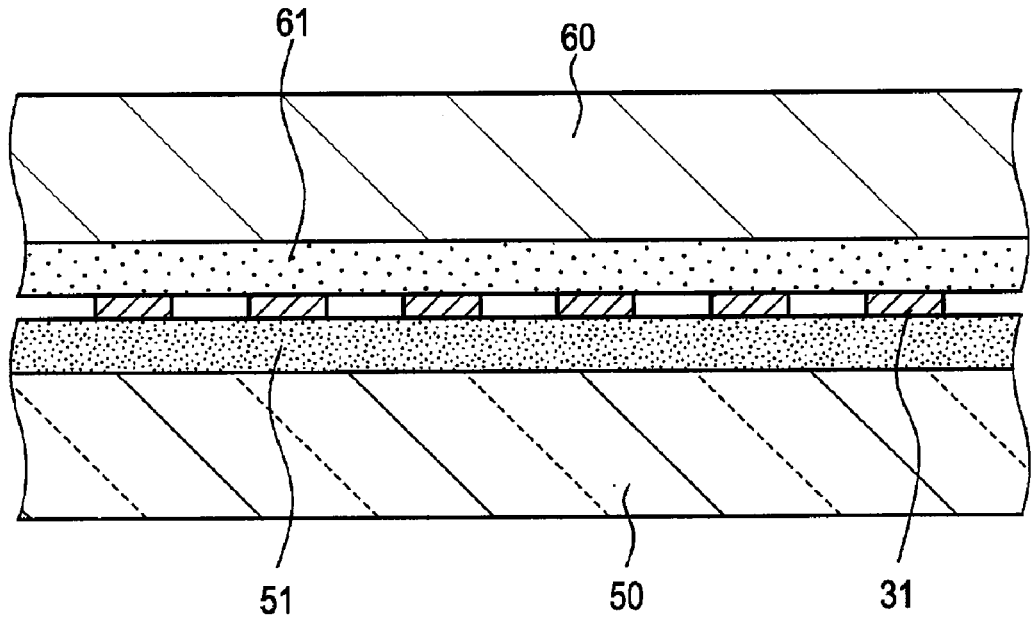
FIGS. 6A and 6B are schematic partial end views of the elements or the like after processing shown in FIG. 5B has been performed in the method of producing an electronic device or the method of producing a light-emitting diode display unit of the first embodiment.
Figure 6B:
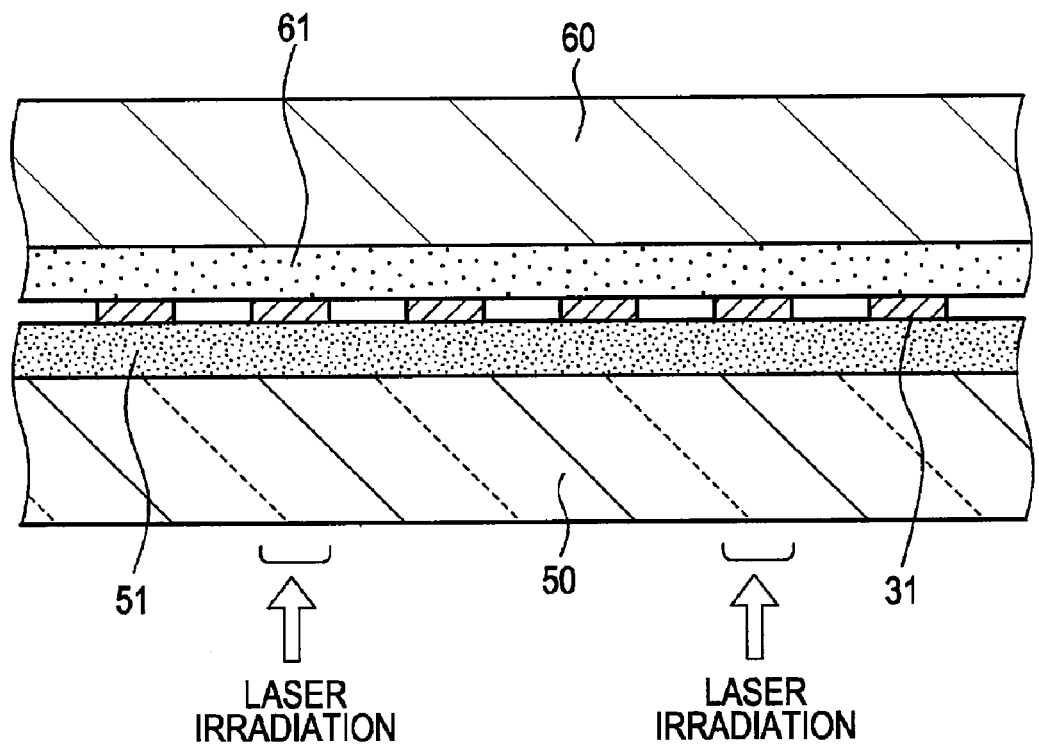

More specifically, in [Step-140], first, the slightly pressure-sensitive layer 61 is pressed on the light-emitting diodes 31 on the substrate for temporary fixing 50 on which the light-emitting diodes 31 remain in an array (two-dimensional matrix shape) (see FIGS. 5B and 6A). Examples of the material of the relay substrate 60 include a glass plate, a metal plate, an alloy plate, a ceramic plate, a semiconductor substrate, and a plastic plate. The relay substrate 60 is held in a positioning device (nor shown). The positional relationship between the relay substrate 60 and the substrate for temporary fixing 50 can be adjusted by operating the positioning device. Subsequently, for example, an excimer laser is irradiated on the light-emitting diodes 31 to be mounted from the back side of the substrate for temporary fixing 50 (see FIG. 6B). As a result, laser ablation occurs, and thus the light-emitting diodes 31 irradiated with the excimer laser are separated from the substrate for temporary fixing 50. Subsequently, when the contact between the relay substrate 60 and the light-emitting diodes 31 is released, the light-emitting diodes 31 separated from the substrate for temporary fixing 50 are adhered to the slightly pressure-sensitive layer 61 (see FIG. 7A).

Figure 7A:
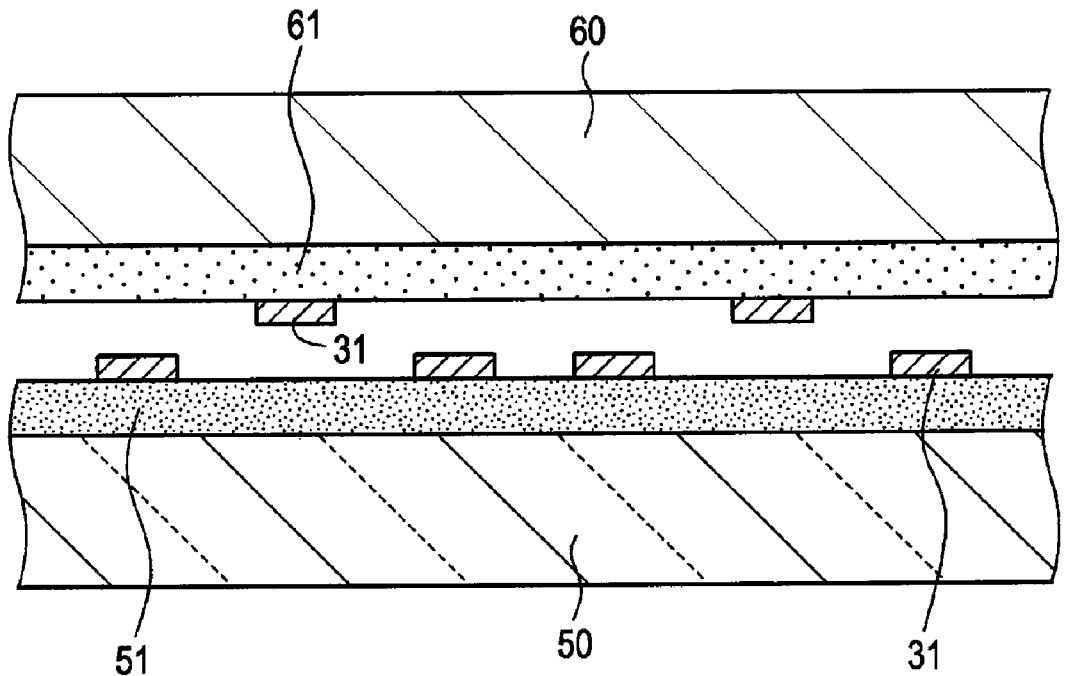
FIGS. 7A and 7B are schematic partial end views of the elements or the like after processing shown in FIG. 6B has been performed in the method of producing an electronic device or the method of producing a light-emitting diode display unit of the first embodiment.
Figure 7B:
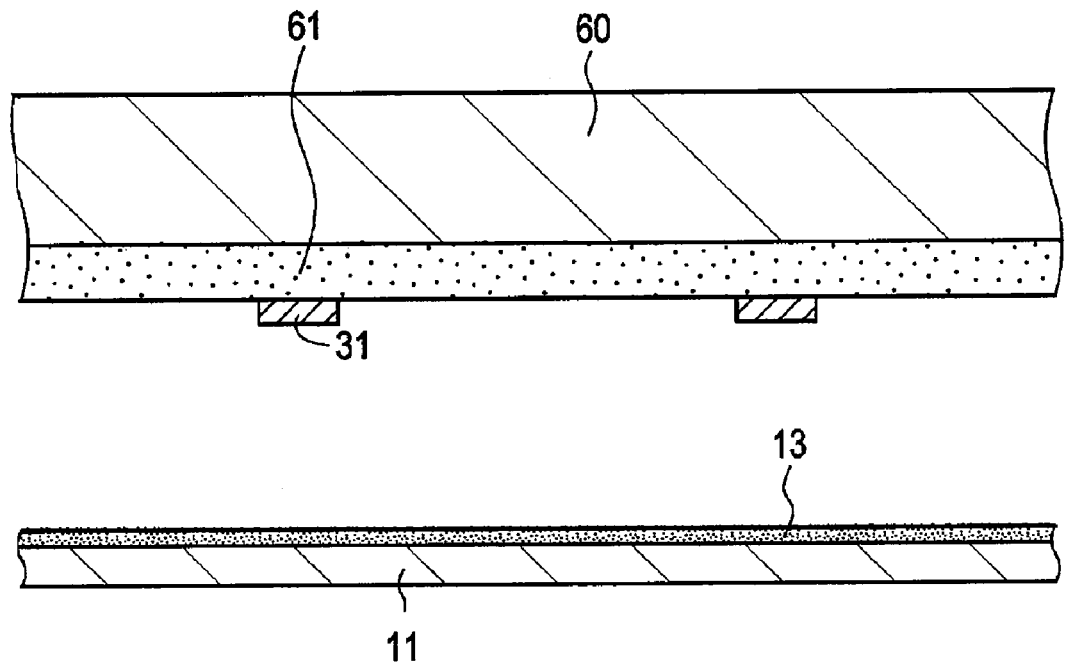
Figure 8:
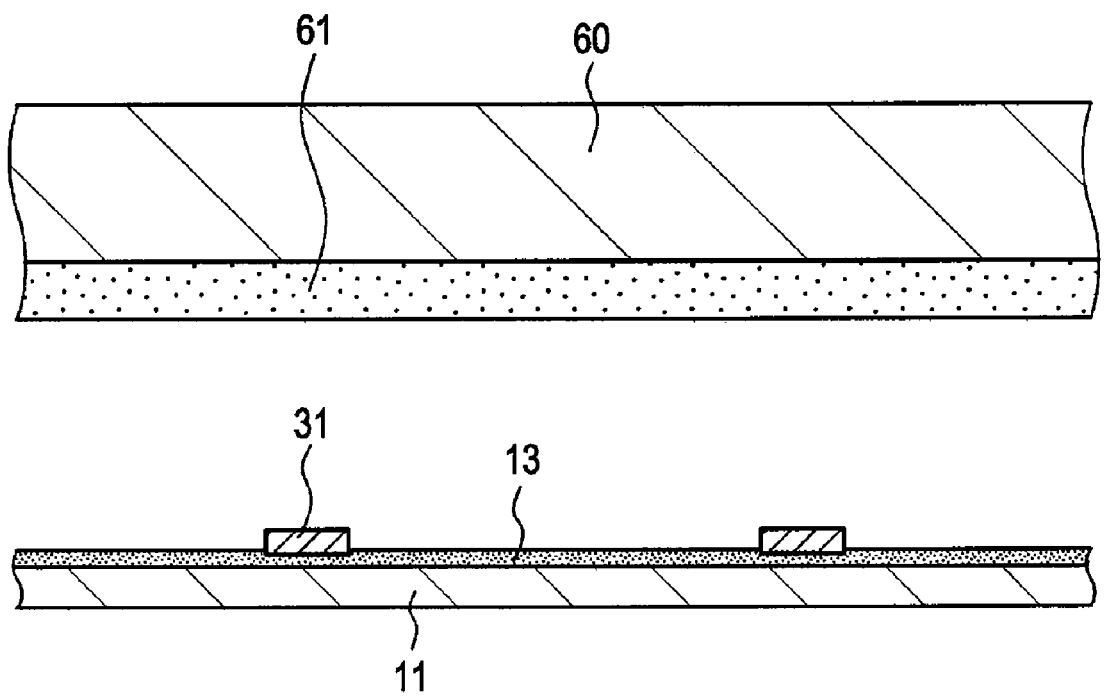
FIG. 8 is a schematic partial end view of the elements or the like after processing shown in FIG. 7B has been performed in the method of producing an electronic device or the method of producing a light-emitting diode display unit of the first embodiment.

The light-emitting diodes 31 are then arranged (moved or transferred) on an adhesive agent layer 13 (see FIGS. 7B and 8). More specifically, the light-emitting diodes 31 are moved from being disposed on the relay substrate 60 to being arranged on the adhesive agent layer 13 of the base for mounting 11 using the black matrix layer 14 as an alignment mark. The light-emitting diodes 31 are merely weakly adhered to the slightly pressure-sensitive layer 61. Accordingly, when the relay substrate 60 is moved in a direction in which the relay substrate 60 is separated from the base for mounting 11 in a state in which the light-emitting diodes 31 are in contact with (pressed on) the adhesive agent layer 13, the light-emitting diodes 31 remain on the adhesive agent layer 13.

For convenience, such a method using the relay substrate 60 is referred to as "step transfer method". By repeating this step transfer method a desired times, a desired number of light-emitting diodes 31 are adhered to the slightly pressure-sensitive layer 61 in a two-dimensional matrix shape and transferred on the base for mounting 11. More specifically, in the first embodiment, in one step transfer, the light-emitting diodes 31 whose number is 160×120 are adhered to the slightly pressure-sensitive layer 61 in a two-dimensional matrix shape and then transferred on the base for mounting 11. Accordingly, by repeating the step transfer method (1,920×1,080)/(160×120)=180 times, 1,920×1,080 light-emitting diodes 31 can be transferred on the base for mounting 11. By repeating a set of [Step-100] to [Step-140] three times, a predetermined number of red-light-emitting diodes, green-light-emitting diodes, and blue-light-emitting diodes can be mounted on the base for mounting 11 at predetermined intervals and pitches.

[Step-150]

Subsequently, the light-emitting diodes 31 are sandwiched between the base for mounting 11 and the film for mounting 21 so that the n-side electrode 36, which is the second connecting portion of each light-emitting diode 31, is in contact with the second wiring 22 and a tensile force is applied to (a tensile stress is present in) the film for mounting 21. The base for mounting 11 is then bonded to the film for mounting 21 with the adhesive agent layer 13 while this state is maintained. More specifically, the base for mounting 11 is covered with the film for mounting 21 in a vacuum atmosphere so that the second connecting portion (n-side electrode 36) of the light-emitting diode 31 is in contact with the second wiring 22 provided on the film for mounting 21. The laminate thus obtained is then charged in a laminating press device and heated at 150° C. for one hour while a pressure of about 1×106 Pa (about 10 kgf/cm2) is applied, thereby curing the adhesive agent layer 13. Thus, the base for mounting 11 is bonded to the film for mounting 21 with the adhesive agent layer 13' in a state in which a tensile force is applied (a tensile stress is applied) to the film for mounting 21. FIG. 3B is a schematic view showing the state in which the film for mounting 21 is bonded to the base for mounting 11, as viewed from above. The base for mounting 11 and the film for mounting 21 are then cut so as to have predetermined dimensions, and the first wiring 12 and the second wiring 22 are connected to a driving circuit by an appropriate method. Thus, the light-emitting diode display unit or an electronic device can be produced.

The light-emitting diodes 31 remaining on the substrate for temporary fixing 50 can be used for mounting on the next base for mounting 11.

Unlike the related art, in the first embodiment, wirings need not be formed after the elements or the light-emitting diodes are mounted on a substrate for a display unit. This method does not include many steps, for example, a step of forming wirings after the mounting of elements or the light-emitting diodes on the substrate for a display unit is not necessary. Consequently, connecting portions provided on the elements or the light-emitting diodes can be connected to the wirings reliably and relatively easily with high reliability.

Furthermore, when fine light-emitting diodes 31 are mounted on the base for mounting 11, a phenomenon in which the light-emitting diodes 31 are misaligned at undesired positions or tilted does not occur. Consequently, the light-emitting diodes 31 can be mounted easily and reliably with a high positional accuracy. Accordingly, a mounting device with a low mounting positional accuracy may be used, thereby realizing a reduction in the production cost of a light-emitting diode display unit in which a large number of light-emitting diodes 31 are arrayed due to a reduction in the process cost, and a reduction in the cost of the mounting device.

Second Embodiment

A second embodiment is a modification of the first embodiment. In the second embodiment, the number of times the step transfer is performed can be markedly decreased compared with that in the first embodiment. In the second embodiment, a light-emitting diode display unit having a diagonal of 26 inches is produced. Therefore, light-emitting diodes whose number is 1,920×1,080×(the number of types of light-emitting diodes required for forming a single pixel, i.e., 3) are mounted on a base for mounting having dimensions of 650 mm×550 mm. A method of producing an electronic device and a method of producing a light-emitting diode display unit of the second embodiment will now be described with reference to FIGS. 4A to 4C, FIGS. 5A and 5B, FIGS. 6A and 6B, FIGS. 7A and 7B, and FIG. 8, which are schematic partial end views of the elements or the like, again.

[Step-200]

First, a plurality of element intermediate structures 40 on which an element intermediate 42 for obtaining light-emitting diodes 31 by being separated in a subsequent step is provided on a substrate for element production 41 are prepared (produced) as in [Step-100] of the first embodiment (see FIG. 4A).

[Step-210]

Figure 9A:
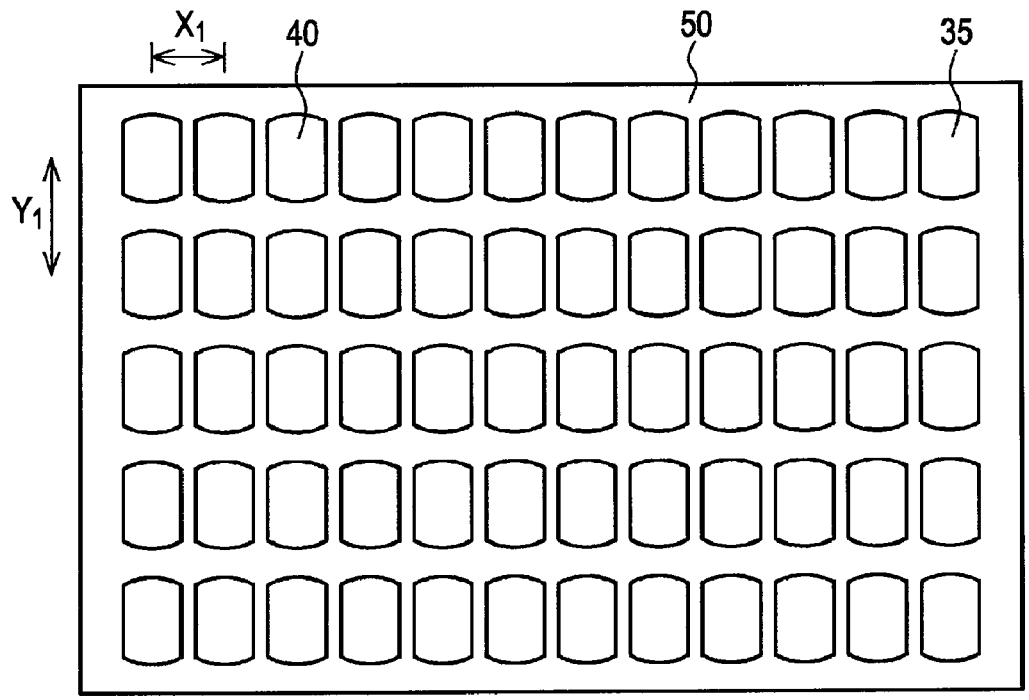
FIGS. 9A and 9B are schematic plan views of elements or the like illustrating a method of producing an electronic device or a method of producing a light-emitting diode display unit of a second embodiment.

Subsequently, the element intermediates 42 of a plurality (two or more, more specifically, in the second embodiment, 12×5=60) of element intermediate structures 40 are temporarily fixed on a substrate for temporary fixing 50. More specifically, the substrate for temporary fixing 50, which is a glass substrate having an adhesive layer 51 composed of an uncured adhesive agent thereon is prepared. A part of each substrate for element production 41 is cut by a dicing method (see the outer shape shown in FIG. 9A). The element intermediate 42 (more specifically, the p-side electrode 35) of each of the element intermediate structures 40 is then bonded to the adhesive layer 51, and the adhesive layer 51 is cured. Thus, the element intermediate structures 40 are temporarily fixed on the substrate for temporary fixing 50 (see FIGS. 9A and 4B). In the second embodiment, twelve element intermediate structures 40 are temporarily fixed on the substrate for temporary fixing 50 in the X direction of the substrate, and five element intermediate structures 40 are temporarily fixed on the substrate for temporary fixing 50 in the Y direction of the substrate. Thus, 60 element intermediate structures 40 are temporarily fixed on the single substrate for temporary fixing 50. The pitch $X_1$ in the X direction of the temporary fixing of the element intermediate structures 40 and the pitch $Y_1$ in the Y direction of the temporary fixing of the element intermediate structures 40 were approximately determined as follows:

$X_1$=48 mm $Y_1$=64.8 mm

[Step-220]

Figure 9B:
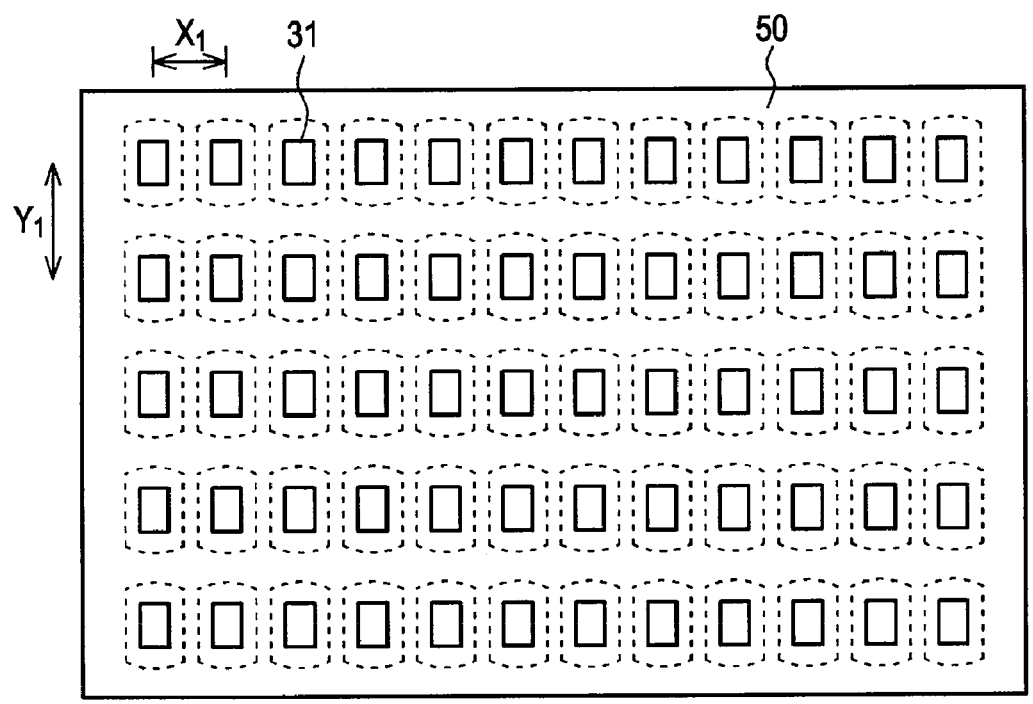

Subsequently, as in [Step-120] of the first embodiment, the substrates for element production 41 included in the plurality of element intermediate structures 40 are removed from the element intermediates 42 (see FIG. 4C). In FIG. 9B, the separated substrates for element production 41 are indicated by the dotted line.

[Step-230]

Subsequently, each of the element intermediates 42 that are temporarily fixed on the substrate for temporary fixing 50 is separated as in [Step-130] of the first embodiment, thus allowing a plurality of light-emitting diodes 31 to be obtained (see FIGS. 9B and 5A). The light-emitting diodes 31 remain on the substrate for temporary fixing 50 in an array (two-dimensional matrix shape). The planer shape of each of the light-emitting diodes 31 is a circular shape having a diameter of 15 µm. Each of the pitch in the X direction and the pitch in the Y direction between the light-emitting diodes 31 is 20 µm. The dimensions of an area where the light-emitting diodes 31 are provided are 24 mm in the X direction and 32.4 mm in the Y direction. Accordingly, 1,200 light-emitting diodes 31 are provided in the X direction, and 1,620 light-emitting diodes 31 are provided in the Y direction in a single substrate for element production 41. That is, 1,944,000 light-emitting diodes 31 can be obtained per substrate for element production 41. In FIG. 9B, areas where the light-emitting diodes 31 remain on the substrate for temporary fixing 50 in an array (two-dimensional matrix shape) are indicated by the rectangles of the solid line.

[Step-240]

Subsequently, as in [Step-140] in the first embodiment, first, a slightly pressure-sensitive layer 61 provided on a relay substrate 60 is pressed on the light-emitting diodes 31 on the substrate for temporary fixing 50 on which the light-emitting diodes 31 remain in an array (two-dimensional matrix shape) (see FIGS. 5B and 6A). Subsequently, for example, an excimer laser is irradiated on light-emitting diodes 31 to be mounted from the back side of the substrate for temporary fixing 50 (see FIG. 6B). As a result, laser ablation occurs, and thus the light-emitting diodes 31 irradiated with the excimer laser are separated from the substrate for temporary fixing 50. Subsequently, when the contact between the relay substrate 60 and the light-emitting diodes 31 is released, the light-emitting diodes 31 separated from the substrate for temporary fixing 50 are adhered to the slightly pressure-sensitive layer 61 (see FIG. 7A). The vertical and horizontal pitches of the light-emitting diodes 31 adhered to the slightly pressure-sensitive layer 61 in a two-dimensional matrix shape are each 300 µm.

The light-emitting diodes 31 are then arranged (moved or transferred) on an adhesive agent layer 13 (see FIGS. 7B and 8). More specifically, the light-emitting diodes 31 are moved from being disposed on the relay substrate 60 to being arranged on the adhesive agent layer 13 of the base for mounting 11 using a black matrix layer 14 as an alignment mark. The light-emitting diodes 31 are merely weakly adhered to the slightly pressure-sensitive layer 61. Accordingly, when the relay substrate 60 is moved in a direction in which the relay substrate 60 is separated from the base for mounting 11 in a state in which the light-emitting diodes 31 are in contact with (pressed on) the adhesive agent layer 13, the light-emitting diodes 31 remain on the adhesive agent layer 13.

This step is referred to as "first step transfer".

Figures 10A, 10B:
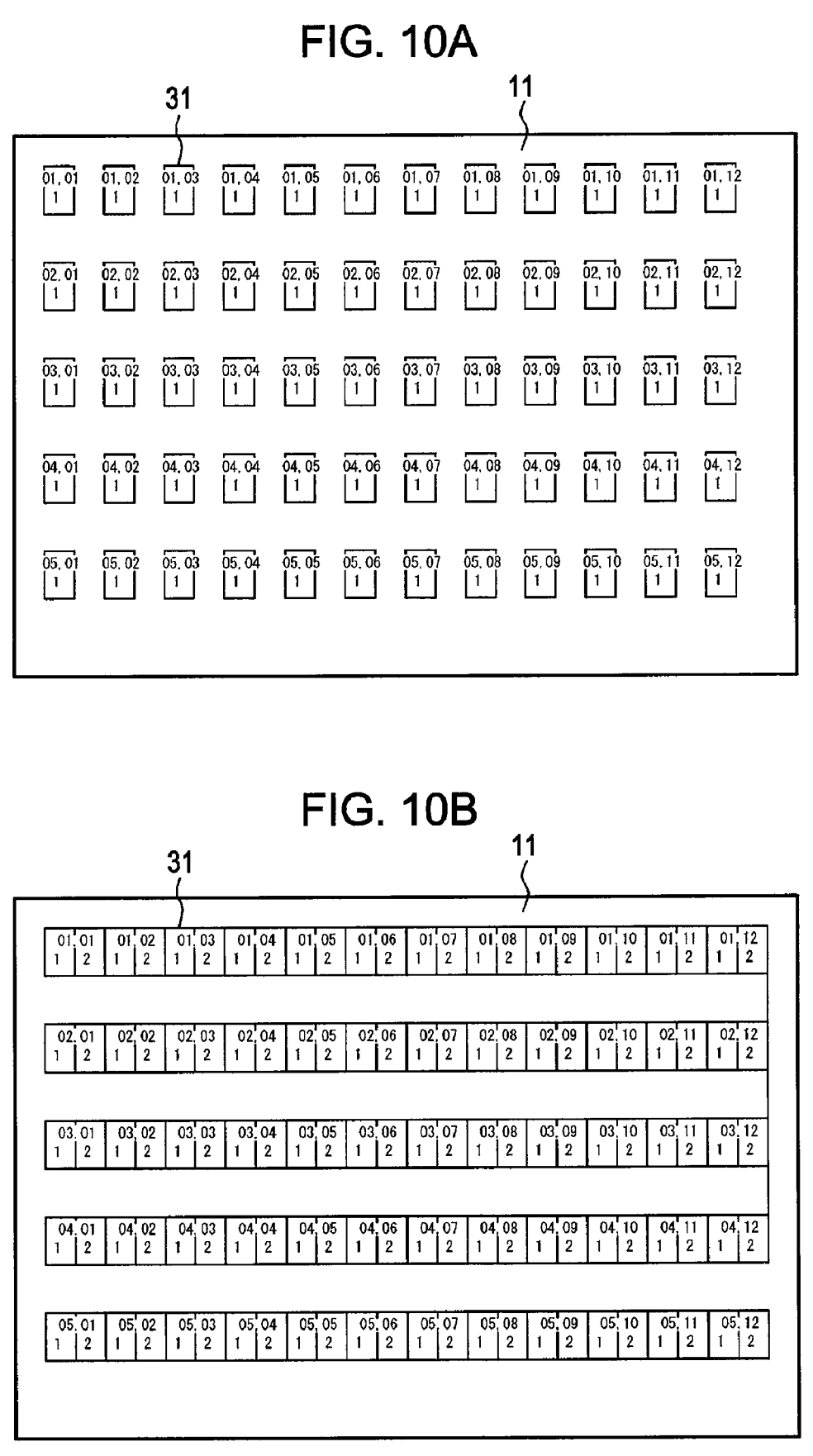

In this step, 8,640 light-emitting diodes 31 (i.e., 80 light-emitting diodes 31 in the X direction and 108 light-emitting diodes 31 in the Y direction) are adhered on the slightly pressure-sensitive layer 61 in a two-dimensional matrix shape per substrate for element production 41 and then transferred on the base for mounting 11. Since 60 substrates for element production 41 are used, 518,400 light-emitting diodes 31 are adhered on the slightly pressure-sensitive layer 61 in a two-dimensional matrix shape and then transferred on the base for mounting 11. FIG. 10A schematically shows this state. In FIG. 10A and FIGS. 10B, 11A and 11B described below, for example, the numbers "05, 06" denote a set of elements (light-emitting diode) 31 corresponding to the substrate for element production disposed in the fifth row and the sixth column. The numbers "1" to "4" surrounded by the rectangles denote the order in which the step transfers are carried out. Furthermore, as described above, 8,640 light-emitting diodes 31 are transferred in each area surrounded by the rectangle by a single step transfer.

Figure 11A:
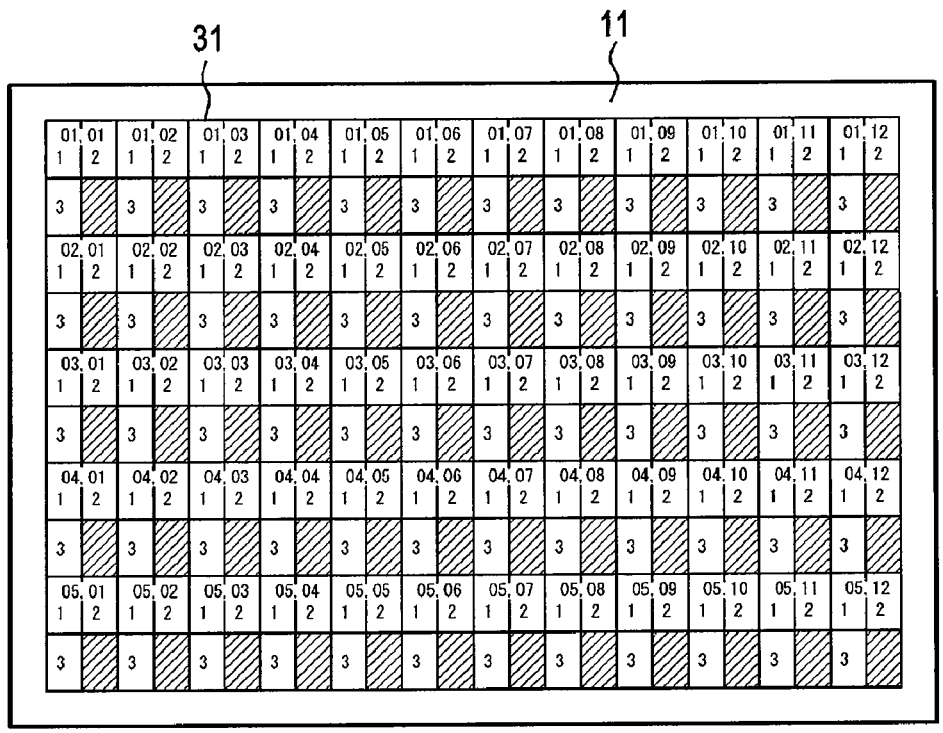
FIGS. 11A and 11B are schematic plan views of the elements or the like after processing shown in FIG. 10B has been performed in the method of producing an electronic device or the method of producing a light-emitting diode display unit of the second embodiment.
Figure 11B:
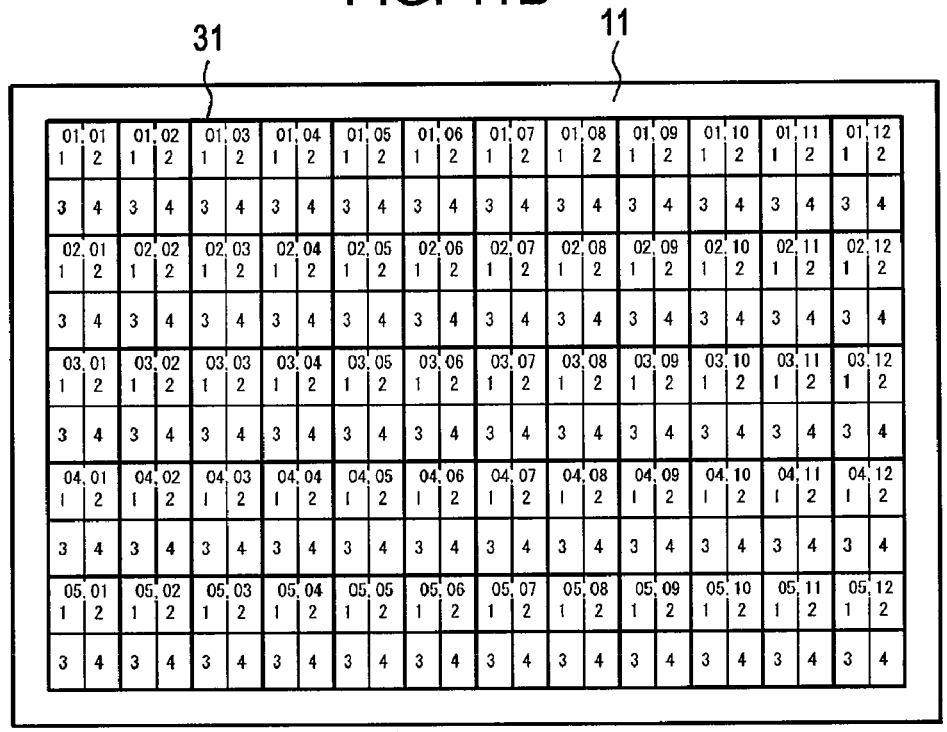

[Step-240] described above is repeated four times. That is, a second step transfer (see FIG. 10B), a third step transfer (see FIG. 11A), and a fourth step transfer (see FIG. 11B) are subsequently performed. In FIG. 11A, for the purpose of comprehension, hatching is drawn in areas for the fourth step transfer. By performing the step transfer four times, light-emitting diodes 31 whose number is 1,920×1,080 can be transferred on the base for mounting 11. Subsequently, [Step-200] to [Step-230] are repeated once and [Step-240] is repeated four times. Furthermore, [Step-200] to [Step-230] are repeated once and [Step-240] is repeated four times. Accordingly, a predetermined number of red-light-emitting diodes, green-light-emitting diodes, and blue-light-emitting diodes can be mounted on the base for mounting 11 at predetermined intervals and pitches.

[Step-250]

Subsequently, as in [Step-150] of the first embodiment, the light-emitting diodes 31 are sandwiched between the base for mounting 11 and the film for mounting 21 so that the n-side electrode 36, which is the second connecting portion of each light-emitting diode 31, is in contact with the second wiring 22 and a tensile force is applied to (a tensile stress is present in) the film for mounting 21. The base for mounting 11 is then bonded to the film for mounting 21 with the adhesive agent layer 13' while this state is maintained. The base for mounting 11 and the film for mounting 21 are then cut so as to have predetermined dimensions, and the first wiring 12 and the second wiring 22 are connected to a driving circuit by an appropriate method. Thus, the light-emitting diode display unit or an electronic device can be produced.

As in the first embodiment, the light-emitting diodes 31 remaining on the substrate for temporary fixing 50 can be used for mounting on the next base for mounting 11.

Suppose that, in the related art, by performing a step transfer once, for example, 80×108 light-emitting diodes are transferred from a single substrate for element production to a base for mounting 11. In this case, in order to transfer 1,920×1,080 light-emitting diodes to the base for mounting 11, it is necessary to perform the step transfer 240 times. In order to move (for example, transfer) three types of light-emitting diodes from substrates for element production to a substrate for a display unit, it is necessary to perform the step transfer 720 times in total. As described above, in the second embodiment, the element intermediates 42 are temporarily fixed on the substrate for temporary fixing 50, and the substrates for element production 41 are then removed from the element intermediates 42. Subsequently, the plurality of element intermediates 42 that are temporarily fixed on the substrate for temporary fixing 50 are separated to obtain individual light-emitting diodes 31. Accordingly, the state after the light-emitting diodes 31 are obtained is equivalent to a state in which the light-emitting diodes 31 are produced as if a substrate for temporary fixing 50 having a size 60 times larger than a substrate for element production 41 acted as a substrate for element production. As a result, 1,920×1,080 light-emitting diodes can be transferred to the base for mounting 11 by performing the step transfer four times. Furthermore, the element intermediates 42 can be separated with a high positional accuracy to produce the light-emitting diodes 31. Accordingly, the light-emitting diodes 31 can be moved (for example, transferred) from the substrate for temporary fixing 50 to the base for mounting 11 without using a mounting device having a high accuracy and a high throughput. As a result, an increase in the production cost of the light-emitting diodes 31 does not occur, and the production of a unit on which a large number of light-emitting diodes 31 are mounted or a light-emitting diode display unit can be easily performed. In addition, the light-emitting diodes 31 are obtained by separating a plurality of element intermediates 42 that are temporarily fixed on the substrate for temporary fixing 50. Therefore, the positional accuracy of the light-emitting diodes 31 remaining on the substrate for temporary fixing 50 after separation depends on the processing accuracy for separating the element intermediates 42 and does not depend on the positional accuracy when the element intermediates 42 are temporarily fixed on the substrate for temporary fixing 50. Accordingly, the element intermediates 42 can be moved from the substrates for element production 41 to the substrate for temporary fixing 50 without using a mounting device having a high accuracy and a high throughput.

As described above, since red-light-emitting diodes, green-light-emitting diodes, and blue-light-emitting diodes can be easily arranged on a base for mounting 11 with a high positional accuracy, the uniformity of the screen of a display unit can be improved. Furthermore, when a light-emitting diode display unit having a size larger than that of a substrate for element production on which light-emitting diodes are formed is produced by a step transfer method, the formation of boundaries of the step transfer can be prevented. This also can improve the uniformity of the screen of the display unit. In addition, a reduction in the production cost of the light-emitting diode display unit due to a reduction in the process cost, and a reduction in the cost of a mounting device can be realized.

Third Embodiment

A third embodiment is a modification of the second embodiment. In the second embodiment, element intermediates 42 of 12×5=60 element intermediate structures 40 were temporarily fixed on a substrate for temporary fixing 50. By repeating [Step-240] of the second embodiment four times, one type of light-emitting diode was mounted on a base for mounting 11 at predetermined intervals and pitches. On the other hand, in the third embodiment, element intermediates 42 of 6×5=30 element intermediate structures 40 are temporarily fixed on a substrate for temporary fixing 50. By repeating the same step as [Step-240] of the second embodiment eight times, one type of light-emitting diode is mounted on a base for mounting 11 at predetermined intervals and pitches. In general, when light-emitting diodes 31 can be mounted on a base for mounting 11 by repeating [Step-240] of the second embodiment α times using M×N element intermediate structures 40, the light-emitting diodes 31 can be mounted on the base for mounting 11 by repeating [Step-240] of the second embodiment m×n×α times using (M/m)×(N/n) element intermediate structures 40 wherein each of M, N, m, n, (M/m), and (N/n) is a positive integer.

Since other steps in the third embodiment can be the same as those in the second embodiment, a detailed description of the steps is omitted. In the third embodiment, the number of times the same step as [Step-240] of the second embodiment is repeated is increased. However, the third embodiment is advantageous in that the number of element intermediate structures 40 to be prepared can be decreased.

The present application has been described using preferred embodiments. However, the present application is not limited to these embodiments, and various modifications can be made on the basis of the technical idea of the present application. For example, numerical values, materials, configurations, structures, shapes, substrates, raw materials, and processes described in the embodiments are given as examples only. According to need, numerical values, materials, configurations, structures, shapes, substrates, raw materials, processes, and the like that are different from those used in the embodiments can be used. For example, in [Step-210] of the second embodiment, element intermediates 42 of 30 element intermediate structures 40 may be temporarily fixed on a substrate for temporary fixing 50, and two such substrates for temporary fixing 50 may be fixed on a supporting substrate. Alternatively, element intermediates 42 of 15 element intermediate structures 40 may be temporarily fixed on a substrate for temporary fixing 50, and four such substrates for temporary fixing 50 may be fixed on a supporting substrate.

In some structures of an electronic device, the first wiring may be composed of a common wiring (common electrode), and the second wiring may have the same structure as that of the first wiring or the second wiring described in the first embodiment. Alternatively, the first wiring may have the same structure as that of the first wiring or the second wiring described in the first embodiment, and the second wiring may be composed of a common wiring (common electrode). Alternatively, the first wiring may be composed of a common wiring (common electrode), and the second wiring may also be composed of a common wiring (common electrode). The common wiring may be composed of a single sheet, or a plurality of sheets or strips in accordance with the structure of an electronic device. When an AC driving of elements (light-emitting diodes) is performed, elements (light-emitting diodes) in which a first connecting portion is in contact with a first wiring and a second connecting portion is in contact with a second wiring and elements (light-emitting diodes) in which a second connecting portion is in contact with a first wiring and a first connecting portion is in contact with a second wiring may be mixed. In the elements (light-emitting diodes) in which a second connecting portion is in contact with a first wiring and a first connecting portion is in contact with a second wiring, the second connecting portion that is in contact with the first wiring would serve as a "first connecting portion" and the first connecting portion that is in contact with the second wiring would serve as a "second connecting portion".

The method of arranging elements on a base for mounting so that the first connecting portion is in contact with the first wiring is also not limited to the method described in the embodiments. For example, in some electronic devices, the elements may be arranged by spraying elements on a base for mounting using a dispenser. Alternatively, the elements may be arranged on a base for mounting using a mounting device such as a robot. The method of producing an electronic device or the method of producing a light-emitting diode display unit according to an embodiment may be performed not only as a batch method but also as a reel-to-reel method in which film rolls are used for the base for mounting and the film for mounting. Furthermore, in the embodiments, an adhesive agent layer for fixing elements or the like to the base for mounting also functions as an adhesive agent layer for bonding the base for mounting to the film for mounting. Alternatively, the adhesive agent layer for fixing elements or the like to the base for mounting and the adhesive agent layer for bonding the base for mounting to the film for mounting may be separated. For the purpose of cleaning, for example, an argon (Ar) plasma treatment may be performed on the exposed first connecting portion and the second connecting portion according to need.

Figure 12A:
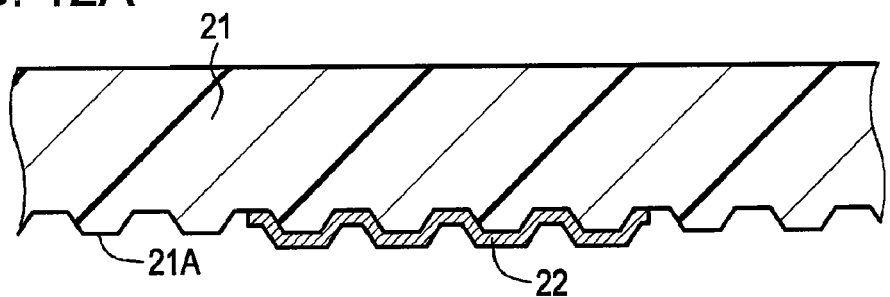
FIGS. 12A and 12C are schematic partial cross-sectional views of a film for mounting according to a modification of the first embodiment.
Figure 12B:
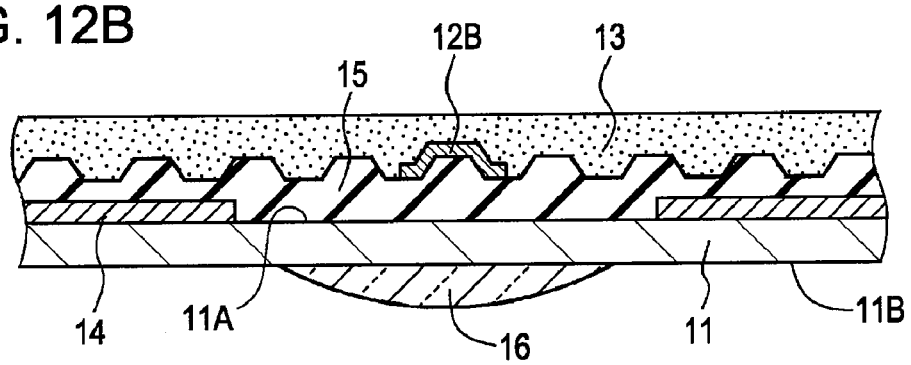
FIGS. 12B and 12D are schematic partial cross-sectional views of a base for mounting according to the modification of the first embodiment.
Figure 12C:
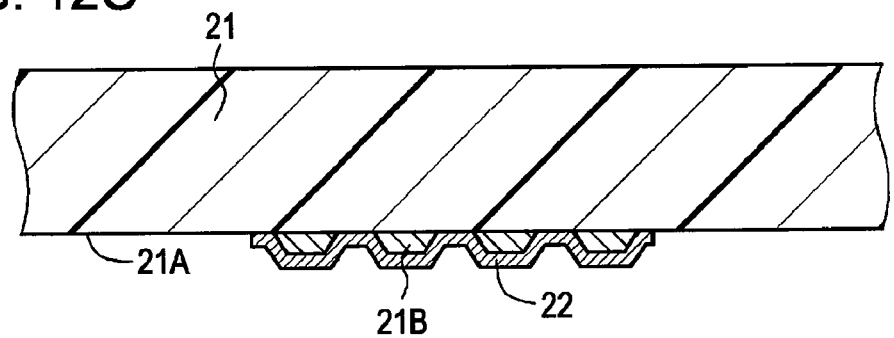
Figure 12D:
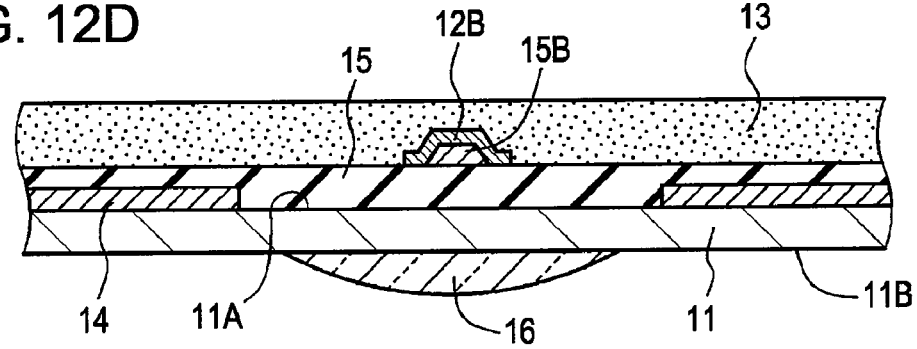

As shown in FIG. 12A, irregularities may be provided on an inner surface 21A of a film for mounting 21 by an appropriated method, and a second wiring 22 may be formed on the inner surface 21A. In addition, as shown in FIG. 12B, irregularities may be provided on an inner surface of an insulating film 15 facing the inner surface 21A of the film for mounting 21, and a first wiring 12 (more specifically, a branch wiring 12B) may be formed on the insulating film 15. This structure can reliably establish the connection between the n-side electrode 36, which is the second connecting portion of a light-emitting diode 31, and the second wiring 22 and the connection between the p-side electrode 35, which is the first connecting portion of the light-emitting diode 31, and the first wiring 12. In some cases, irregularities may be provided on the inner surface 21A of the film for mounting 21, and the second wiring 22 may be merely formed on the inner surface 21A (that is, the formation of irregularities on the inner surface of the insulating film 15 facing the inner surface 21A of the film for mounting 21 may be omitted). Alternatively, irregularities may be formed only on areas of the inner surface 21A of the film for mounting 21 on which the second wiring 22 is to be formed. Irregularities may be formed only on areas of the inner surface of the insulating film 15 on which the first wiring 12 is to be formed. Furthermore, as shown in FIG. 12C, a material 21B, which can be made of a resin or a metal, for forming irregularities on an inner surface 21A of a film for mounting 21 may be provided. As shown in FIG. 12D, a material 15B, which can be made of a resin or a metal, for forming irregularities on an inner surface of an insulating film 15 may be provided.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An electronic device comprising:
    a base having a first wiring thereon, the first wiring including a plurality of main wirings each extending in a strip shape and a plurality of branch wirings extending from each of the main wirings;
    a flexible film having a second wiring thereon;
    a plurality of elements each including a first electrode and a second electrode;
    an adhesive agent layer; and
    a black matrix layer provided on areas which are disposed on an inner surface of the base facing the film and on which the elements are not provided,
    wherein each of the elements is sandwiched between the base and the film in a state in which the first electrode is in contact with the first wiring, the second electrode is in contact with the second wiring, and a tensile force is applied to the film, and,
    in this state, the base and the film are bonded with the adhesive agent layer.

2. The electronic device according to claim 1, wherein the elements are light-emitting diodes.

3. The electronic device according to claim 2, wherein the black matrix layer is used as an alignment mark.

4. The electronic device according to claim 1, wherein an insulating film is provided on the black matrix layer and the inner surface of the base.

5. The electronic device according to claim 2, wherein convex lenses are provided at positions which are disposed on an outer surface of the base, the outer surface being opposite the inner surface of the base facing the film, and to which light from the elements is emitted.

6. The electronic device according to claim 1, wherein when the total thickness of the first wiring and the base before the bonding with the film is represented by $t_1$, the total thickness of the first wiring and the base after the bonding with the film is represented by $t'_1$, the total thickness of the second wiring and the film before the bonding with the base is represented by $t_2$, the total thickness of the second wiring and the film after the bonding with the base is represented by $t'_2$, the thickness of the adhesive agent layer before the bonding is represented by $t_{Adh}$, and the thickness of each of the elements is represented by $t_D$, the following relationship is satisfied:

$$t_1 + t_2 + t_{Adh} \approx t'_1 + t'_2 + t_D$$

wherein $t'_1 \leq t_1$, $t'_2 < t_2$, and $t_{Adh} < t_D$.

* * * * *